United States Patent
Yamanaka et al.

(10) Patent No.: US 7,851,121 B2
(45) Date of Patent: Dec. 14, 2010

(54) PHOTOSENSITIVE POLYIMIDE COMPOSITION AND POLYIMIDE PRECURSOR COMPOSITION

(75) Inventors: Kazuhiro Yamanaka, Tokyo (JP); Michael Romeo, Atlanta, GA (US); Clifford Henderson, Atlanta, GA (US); Kazuhiko Maeda, Tokyo (JP)

(73) Assignees: Central Glass Co., Ltd., Ube-shi, Yamaguchi (JP); Georgia Tech Research Corporation, Atlanta, GA (US)

( * ) Notice: Subject to any disclaimer, the term of this patent is extended or adjusted under 35 U.S.C. 154(b) by 219 days.

(21) Appl. No.: 12/278,349

(22) PCT Filed: Feb. 10, 2006

(86) PCT No.: PCT/US2006/004611

§ 371 (c)(1),
(2), (4) Date: Aug. 5, 2008

(87) PCT Pub. No.: WO2007/092011

PCT Pub. Date: Aug. 16, 2007

(65) Prior Publication Data

US 2009/0176172 A1    Jul. 9, 2009

(51) Int. Cl.
*G03F 7/004* (2006.01)
*G03F 7/023* (2006.01)

(52) U.S. Cl. .................. 430/191; 430/192; 430/193; 430/270.1; 430/906

(58) Field of Classification Search ............ 430/191, 430/192, 270.1, 906
See application file for complete search history.

(56) References Cited

U.S. PATENT DOCUMENTS

| 5,114,826 | A  | * | 5/1992  | Kwong et al. ............... 430/192 |
| 6,143,467 | A  |   | 11/2000 | Hsu et al. |
| 6,436,593 | B1 | * | 8/2002  | Minegishi et al. ............. 430/18 |
| 6,600,006 | B2 | * | 7/2003  | Jung et al. .................. 528/353 |
| 6,670,090 | B1 |   | 12/2003 | Hsu et al. |
| 6,677,099 | B1 | * | 1/2004  | Ishii et al. ................... 430/165 |

OTHER PUBLICATIONS

International Search Report of PCT/US2006/604611, date of mailing Sep. 6, 2006.

* cited by examiner

*Primary Examiner*—John S Chu
(74) *Attorney, Agent, or Firm*—Westerman, Hattori, Daniels & Adrian, LLP

(57) ABSTRACT

There is provided a photosensitive composition including a polyimide or polyimide precursor. The polyimide and polyimide precursor of the present invention includes a group of a first acid-cleavable group, a first base-cleavable group or a first thermally-cleavable group, and another group of a hydrophilic group, or a protected hydrophilic group by a second acid-cleavable group, a second base-cleavable group, or a crosslinkable group.

17 Claims, 5 Drawing Sheets

PHOTOSENSITIVE POLYIMIDE COMPOSITION AND POLYIMIDE PRECURSOR COMPOSITION

TECHNICAL FIELD

The present invention relates to a novel photosensitive composition including a polyimide or a polyimide precursor.

BACKGROUND

Photosensitive compositions including a polyimide/polyimide precursor (or polyamic acid) have been widely used to form polymer relief patterns serving as insulation or passivation films for very large scale integration (VLSI) and multichip modules (MCM) because polyimides have excellent properties especially in terms of thermal stability and chemical resistance. Conventionally, the photosensitive compositions include a photosensitive additive, which serves to control the dissolution rate of the composition into an alkaline developer solution. The dissolution rate into the developer solution can be differentiated between the exposed region and the non-exposed region, thereby allowing development of a pattern. The developed pattern is subjected to an appropriate thermal process to form a relief pattern.

In the case of conventional polyimides used in photosensitive compositions, the polyimide includes alkaline soluble groups. However, once the photosensitive compositions are formed into a relief pattern, those alkaline soluble groups should be removed because they can negatively impact the desired physiochemical properties of the polyimide relief pattern. For example, the presence of such alkaline soluble groups can result in higher water absorbance and higher dielectric constants than in a similar polymer without such groups. In order to remove the alkaline soluble groups, the developed pattern generally has to be heated at a high temperature, e.g., at 320° C. or more.

Thus, one objective of the present invention is to provide a photosensitive composition including a polyimide, which can be formed into a relief pattern at a lower temperature. Another objective is to provide a photosensitive composition including a polyimide, whose alkaline soluble groups can be removed after developing a polyimide pattern at a lower temperature. A further objective of the present invention is to provide a photosensitive composition including a polyimide precursor, whose alkaline soluble groups can be removed after developing a polyimide pattern at a lower temperature.

SUMMARY OF THE INVENTION

According to the first aspect of the present invention, there is provided a photosensitive composition including: a polyimide comprising a repeating unit as represented by Formula 1:

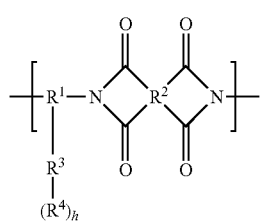

Formula 1

In Formula 1, R1 represents an aliphatic, alicyclic, aromatic or heterocyclic group; R2 represents an aliphatic, alicyclic, aromatic or heterocyclic group; R3 represents a bifunctional or more organic group selected from the group containing a first acid-cleavable group, first base-cleavable group or first thermally-cleavable group; R4 represents a monofunctional hydrophilic group or a monofunctional hydrophilic group protected by second acid-cleavable group, second base-cleavable group, or crosslinkable cleavable group; and, h represents an integer of 1 or more. In particular, h represents 1 or more and 8 or less in one embodiment; and h represents 1 or more and 4 or less in another embodiment; and h represents 1 or 2 in yet another embodiment. Generally, h corresponds to the number minus 1 of the functionality of R3. The photosensitive composition further includes a photosensitive additive.

Since a pre-formed polyimide is used, conversion of polyamic acids into a polyimide is not involved, and thus the relief pattern can be formed at a lower temperature. R4 can change the alkali solubility of the polyimide when the photosensitive composition is irradiated to actinic light. The photosensitive composition of the present invention can be prepared either in a positive type or a negative type. R3 can be cleaved after developing a pattern, so that the groups of R3 and R4, including a hydrophilic group, can be removed, resulting in improved stability and reliability of the relief pattern.

According to the second aspect of the present invention, there is provided a photosensitive composition including: a polyimide precursor comprising a repeating unit as represented by Formula 2:

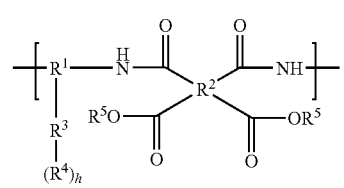

Formula 2

In Formula 2, R1 represents an aliphatic, alicyclic, aromatic or heterocyclic group; R2 represents an aliphatic, alicyclic or aromatic group; R3 represents a bifunctional or more organic group selected from the group containing a first acid-cleavable group, first base-cleavable group or first thermally-cleavable group; R4 represents a monofunctional hydrophilic group or a monofunctional hydrophilic group protected by second acid-cleavable group, second base-cleavable group, or crosslinkable cleavable group; R5 represents hydrogen or a third acid-cleavable group; and h represents an integer of 1 or more. In particular, h represents 1 or more and 8 or less in one embodiment; and h represents 1 or more and 4 or less in another embodiment; and h represents 1 or 2 in yet another embodiment. Generally, h corresponds to the number minus 1 of the functionality of R3. The photosensitive composition further includes a photosensitive additive.

Since the polyimide precursor can be easily dissolved into a solvent, it becomes easy to make a varnish solution and to make a relief pattern. It is not necessary to convert the precursor into a polyimide. R4 and/or R5 can change the alkali solubility of the polyimide when the photosensitive composition is irradiated to actinic light. The photosensitive composition of the present invention can be prepared either as a positive type or a negative type. R3 can be cleaved after developing a pattern, so that the groups of R3 and R4, which can include a hydrophilic group, can be removed, resulting in improved stability and reliability of the relief pattern.

Examples of the photosensitive additive can include a diazonaphthoquinone compound (DNQ), a photo-acid generator (PAG), a photo-base generator (PBG), a free radical generator (FRG), and combinations thereof. The photosensitive additive can differentiate the dissolution rate into a developer solution in order to develop a pattern. The photosensitive composition can further include a crosslinker, a thermal acid generator (TAG), and a photosensitizer, if necessary.

Figure 1:
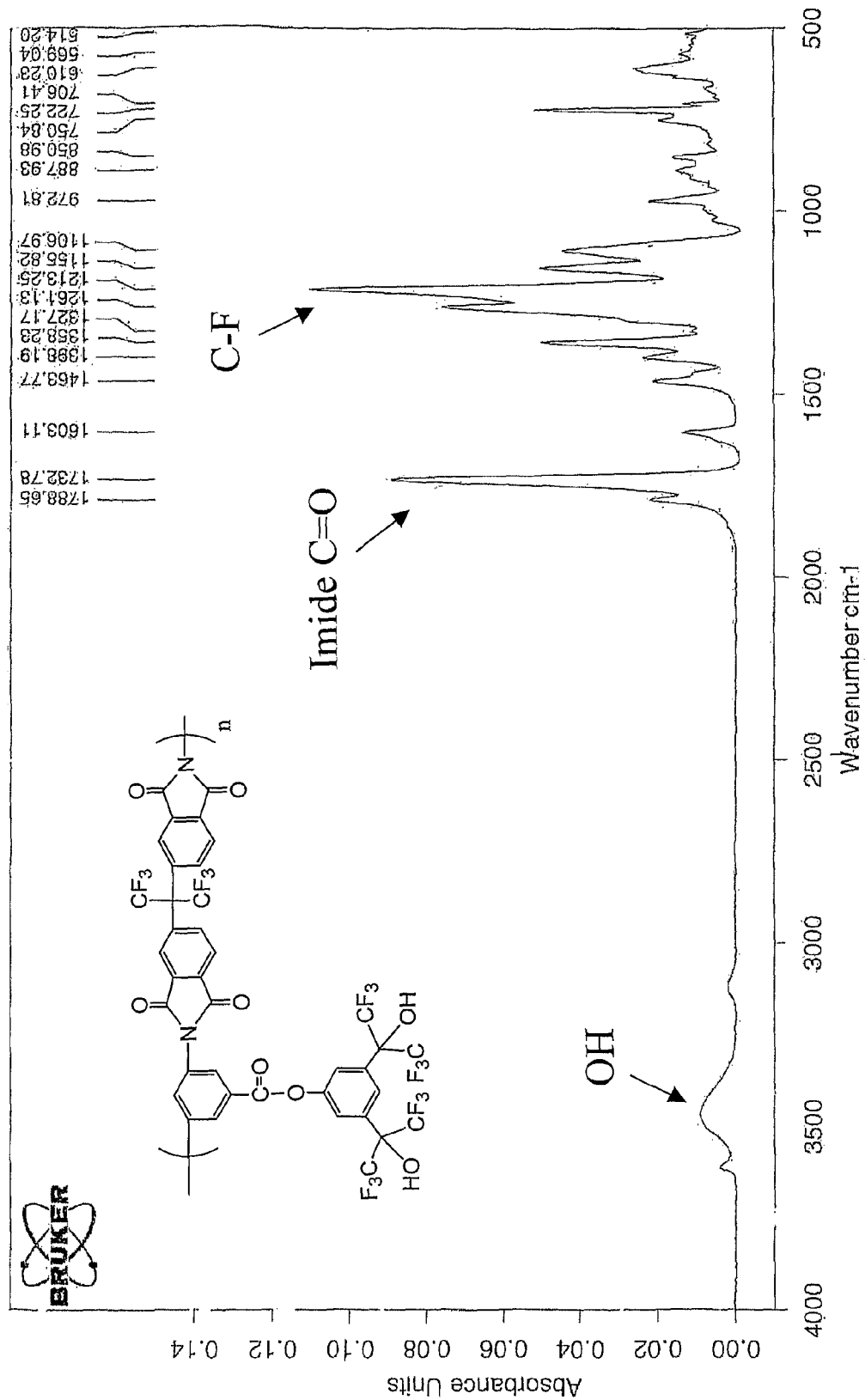
FIG. 1 shows an IR spectrum of one of the polyimides used in the present invention.

DETAILED DESCRIPTION OF THE INVENTION (A) Polyimide and Polyimide Precursor (1) R3

After developing the pattern in the developer solution, the groups of R3 and R4 can be removed from the polyimide or the polyimide precursor. Thus, the stability and reliability of the relief pattern are improved.

(i) Examples of R3

As to the polyimide or polyimide precursor, examples of R3 are shown in Formulas 3 through 7, and Formulas 3a through 7a below. These groups can be incorporated in the polyimide or polyimide precursor by various methods.

Among the groups listed below, Formulas 3, 3a, 4, 4a, 5, 5a, 6 and 6a can serve as an acid-cleavable group. These groups can be easily cleaved in the presence of an acid. This group can be cleaved in the presence of an acid at a temperature between 50 and 180° C. in one embodiment, and at a temperature between 80 and 130° C. in another embodiment.

Among the groups listed below, Formulas 7 and 7a can serve as a base-cleavable group. The group can be easily cleaved at the presence of a base. This group can be cleaved in the presence of a base at a temperature between 50 and 180° C. in one embodiment, and at a temperature between 80 and 130° C. in another embodiment.

Among the groups listed below, Formulas 3, 3a, 4, 4a, 5, 5a, 6 and 6a can also serve as thermally-cleavable groups. The groups can be easily cleaved at a temperature between 100° C. and 350° C. in one embodiment, and at a temperature between 120° C. and 270° C. in another embodiment.

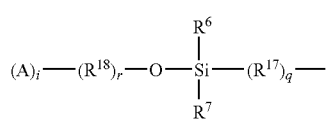

Formula 3

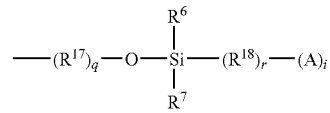

Formula 3a

In Formulas 3 and 3a, A represents R4; R6, R7, R17, and R18 each represents an organic group having a carbon number of 1 to 40; r and q each represents an integer of 0 or 1; and i represents h which is an integer of 1 or more. R6, R7, R17, and R18 each can include an aliphatic, alicylclic, aromatic or heterocyclic group.

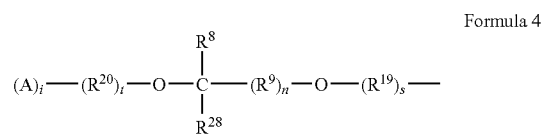

Formula 4

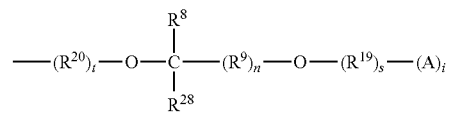

Formula 4a

In Formulas 4 and 4a, A represents R4; R8 and R28 each represents hydrogen or an organic group having a carbon number of 1 to 40; R9, R19, and R20 each represents an organic group having a carbon number of 1 to 40; n, s, and t each represents an integer of 0 or 1; and i represents h which is an integer of 1 or more. R8, R9, R19, R20, and R28 each can include an aliphatic, alicylclic, aromatic or heterocyclic group.

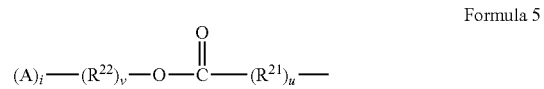

Formula 5

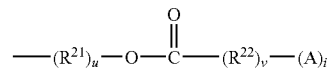

Formula 5a

In Formulas 5 and 5a, A represents R4; R21 and R22 each represents an organic group having a carbon number of 1 to 40; u and v each represents an integer of 0 or 1; and i represents h which is an integer of 1 or more. R21 and R22 each can include an aliphatic, alicylclic, aromatic or heterocyclic group.

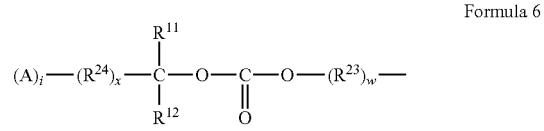

Formula 6

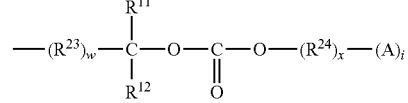

Formula 6a

In Formulas 6 and 6a, A represents R4; R11 and R12 each represents hydrogen or an organic group having a carbon number of 1 to 40; R23 and R24 each represents an organic group having a carbon number of 1 to 40; w and x each represents an integer of 0 or 1; and i represents h which is an integer of 1 or more. R11, R12, R23 and R24 each can include an aliphatic, alicylclic, aromatic or heterocyclic group.

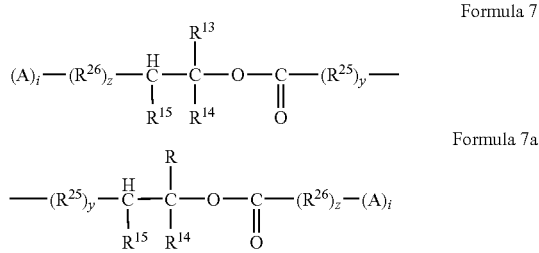

Formula 7

Formula 7a

In Formulas 7 and 7a, A represents R4; R13, R14 and R15 each represents hydrogen or an organic group having a carbon number of 1 to 40; R25 and R26 each represents an organic group having a carbon number of 1 to 40; y and z each represents an integer of 0 or 1; and i represents h which is an integer of 1 or more. R13, R14, R15, R25, and R26 each can include an aliphatic, alicylclic, aromatic or heterocyclic group.

(2) R4

In order to develop a pattern in a developer solution, the alkali solubility of the photosensitive composition must be differentiated between the exposed region and the non-exposed region. In the present invention, the group represented by R4 of the polyimide or the polyimide precursor (e.g., polyamic acid) can serve to change the alkali solubility.

(i) If R4 of Formula 1 is a hydrophilic group, the polyimide or polyimide precursor, per se, is soluble in an alkali developer solution. When such a polyimide or polyimide precursor coexists with a photosensitive additive, the alkali solubility of the polyimide or polyimide precursor can be decreased. Thus, the polyimide or polyimide precursor is generally insoluble in a developer solution. However, when irradiated with actinic light, the photosensitive additive is changed into an alkali soluble group. Thus, the exposed region can be dissolved in an alkali solution, so that a photosensitive composition can be provided as a positive material.

(ii) If R4 is a hydrophilic group partially or wholly protected by an acid-cleavable group, the polyimide or polyimide precursor, per se, can be insoluble in an alkali developer solution. In this case, the photosensitive composition generally includes a photoacid generator (PAG). When the photosensitive composition is exposed to actinic light, the photoacid generator generates an acid which cleaves the acid-cleavable groups of R4 such that the polyimide or polyimide precursor becomes soluble in an alkali developer solution. Thus, such a photosensitive composition can be provided as a positive material.

(iii) If R4 is a hydrophilic group partially or wholly protected by a base-cleavable group, the polyimide or polyimide precursor, per se, can be insoluble in an alkali solution. In this case, the photosensitive composition generally includes a photobase generator (PBG). When the photosensitive composition is exposed to actinic light, the photobase generator generates a base, which cleaves or releases the base-cleavable groups of R4 such that the polyimide or polyimide precursor becomes soluble in the alkali aqueous solution. Thus, such a photosensitive composition can be provided as a positive resist material.

(iv) If R4 is a hydrophilic group partially or wholly protected by a crosslinkable group, the polyimide or polyimide precursor, per se, can be generally soluble in an alkali solution. In this case, the photosensitive composition of the present invention generally includes a photobase generator (PBG), photoacid generator (PAG) or free radical generator (FRG). When it is exposed to actinic light, the PBG generates a base or the PAG generates an acid or the FRG generates a free radical, which causes crosslinking of the crosslinkable group of the polyimide or polyimide precursor, such that the polyimide or polyimide precursor becomes insoluble in the alkali developer solution. Thus, such a photosensitive composition can be provided as a negative resist material.

According to the present invention, the group represented by R4 can change the alkali solubility of the photosensitive composition to develop a pattern. As to the polyimide or polyimide precursor, examples shown by R4 can include the following groups represented by Formulas 8 to 12:

Formula 8

—OR$^{16}$  Formula 9

—COOR$^{16}$  Formula 10

—SO$_3$R$^{16}$  Formula 11

—NR$^{16}$—SO$_2$CF$_3$  Formula 12

In the Formulas 8 to 12, R16 represents hydrogen, an acid-cleavable group, a base-cleavable group or a crosslinkable group. These groups can be incorporated in the polyimide or polyimide precursor by various methods.

(v) Acid-Cleavable Group

The acid-cleavable group is a group which decreases the alkali solubility of the polyimide. The acid-cleavable protecting group of the present invention when exposed to actinic light is cleaved such that the alkali solubility of the material is recovered. The acid-cleavable groups included in R4 or R5 can be incorporated by replacing a hydrogen atom of the polyimide or polyimide precursor with a corresponding acid-cleavable group. However, the production method of the polyimide is not limited thereto, and different processes for obtaining the same repeating unit can be envisaged to one skilled in the art.

Examples of the acid-cleavable group are alkoxycarbonyl groups, acetal groups, and silyl groups. Examples of the alkoxycarbonyl groups can include tert-butoxycarbonyl group, tert-butoxycarbonyl methyl, tert-amyloxycarbonyl group, methoxycarbonyl group, ethoxycarbonyl group and i-propoxycarbonyl group. Examples of the acetal groups can include methoxymethyl group, ethoxyethyl group, methoxy ethoxyethyl, butoxyethyl group, cyclohexyloxyethyl group, benzyloxyethyl group, phenethyloxyethyl group, ethoxypropyl group, benzyloxypropyl group, phenethyloxypropyl group, ethoxybutyl group, and ethoxyisobutyl group. Examples of the silyl groups can include trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyl-dimethylsilyl group, methyl-di-t-butylsilyl group, tri-t-butylsilyl group, phenyldimethylsilyl group, methyldiphenylsilyl group and triphenylsilyl group.

(vi) Base-Cleavable Group

The base-cleavable group included in R4 can be partially or wholly incorporated by replacing a hydrogen atom of a polyimide or a polyimide precursor with a corresponding base-cleavable group. The production method of the polyimide is not limited thereto, and different processes for obtaining the same repeating unit can be envisaged to one skilled in the art. The base-cleavable group is a group which decreases the alkali solubility of the polyimide.

Examples of the base-cleavable group are alkoxycarbonyl groups such as 2-cyano-1-methylethoxycarbonyl group, 2,2-dicyano-1-methylethoxycarbonyl group, 9-fluorenylmethoxycarbonyl groups, 2-methylsulfonylethoxycarbonyl group, 2-acetyl-1-methylethoxycarbonyl group, 2-benzoyl-1-methylethoxycarbonyl group, and 2-cyano-2-ethoxycarbonyl-2-methylethoxycarbonyl group.

(vii) Crosslinkable Group

The crosslinkable groups included in R4 can be partially or wholly incorporated by replacing a hydrogen atom of a polyimide or polyimide precursor with a corresponding crosslinkable group. Generally, the crosslinkable group can be partially incorporated so as to keep the polyimide soluble in the alkaline developer solution. The production method of the polyimide is not limited thereto, and different processes for obtaining the same repeating unit can be envisaged to one skilled in the art. The crosslinkable groups of the present invention can include a cyclic epoxy group, vinyl ether, acrylate, methacrylate, alkoxy methyl amino or vinyl group, which can cause crosslinking by the action of the photosensitive additive of the present invention when irradiated to actinic light.

(3) R1

In preparing the polyimide and polyimide precursor of the present invention, various diamines including aliphatic, alicyclic, aromatic or heterocyclic group can be used. These diamines can be copolymerizable with other diamines. Examples of the useful diamines are 1,2-phenylenediamine, 1,3-phenylenediamine, 1,4-phenylenediamine, 3,3'-diaminobiphenyl, 3,4'-diaminobiphenyl, 4,4'-diaminobiphenyl, 3,3"-diaminoterphenyl, 4,4"-diaminoterphenyl, oxy-3,3'-dianiline, oxy-4,4'-dianiline, thio-3,3'-dianiline, thio-4,4'-dianiline, sulfonyl-3,3'-dianiline, sulfonyl-4,4'-dianiline, methylene-3,3'-dianiline, methylene-4,4'-dianiline, 1,2-ethylene-3,3'-dianiline, 1,2-ethylene-4,4'-dianiline, 2,2-propylidene-3,3'-dianiline, 2,2-propylidene-4,4'-dianiline, 1,1,1,3,3,3-hexafluoro-2,2-propylidene-3,3'-dianiline, 1,1,2,2,3,3-hexafluoro-1,3-propylidene-3,3'-dianiline, 1,1,1,3,3,3-hexafluoro-2,2-propylidene-3,3'-dianiline, 1,1,1,3,3,3-hexafluoro-2,2-propylidene-4,4'-dianiline, 1,3-bis(3-aminophenoxy)benzene, 1,3-bis(4-aminophenoxy)benzene, 1,3-bis(3-aminophenylthio)benzene, 1,3-bis(4-aminophenylthio)benzene, 1,3-bis(3-aminophenylsulfonyl)benzene, 1,3-bis(4-aminophenylsulfonyl)benzene, 1,3-bis[2-(3-aminophenyl)-2-propyl]benzene, 1,3-bis[2-(4-aminophenyl)-2-propyl]benzene, 1,3-bis[2-(3-aminophenyl)-1,1,1,3,3,3-hexafluoro-2-propyl]benzene, 1,3-bis[2-(4-aminophenyl)-1,1,1,3,3,3-hexafluoro-2-propyl]benzene, 1,4-bis(3-aminophenoxy)benzene, 1,4-bis(3-aminophenoxy)benzene, 1,4-bis(3-aminophenylthio)benzene, 1,4-bis(4-aminophenoxy)benzene, 1,4-bis(3-aminophenylsulfonyl)benzene, 1,4-bis(4-aminophenylsulfonyl)benzene, 1,4-bis[2-(4-aminophenyl)-2-propyl]benzene, 1,4-bis[2-(3-aminophenyl)-1,1,1,3,3,3-hexafluoro-2-propyl]benzene, 1,4-bis[2-(4-aminophenyl)-1,1,1,3,3,3-hexafluoro-2-propyl]benzene, 2,2-bis[4-(3-aminophenoxy)phenyl]-1,1,1,3,3,3-hexafluoropropane, 2,2-bis[4-(4-aminophenoxy)phenyl]-1,1,1,3,3,3-hexafluoropropane, 5-fluoro-1,3-phenylenediamine, 2-fluoro-1,4-phenylenediamine, 2,5-fluoro-1,4-phenylenediamine, 2,4,5,6-hexafluoro-1,3-phenylenediamine, 2,3,5,6-hexafluoro-1,4-phenylenediamine, 3,3'-diamino-5,5'-difluorobiphenyl, 4,4'-diamino-3,3'-difluorobiphenyl, 3,3'-diamino-2,2',4,4',5,5',6,6'-octafluorobiphenyl, oxy-5,5'-bis(3-fluoroaniline), oxy-4,4'-bis(2-fluoroaniline), oxy-4,4'-bis(3-fluoroaniline), sulfonyl-4,4'-bis(2-fluoroaniline), sulfonyl-4,4'-bis(3-fluoroaniline), 1,3-bis(3-amino-5-fluorophenoxy)benzene, 1,3-bis(3-amino-5-fluorophenoxy)-5-fluorobenzene, 5-(trifluoromethyl)-1,3-phenylenediamine, 2-(trifluoromethyl)-1,4-phenylenediamine, 2,5-bis(trifluoromethyl)-1,4-phenylenediamine, 2,2'-bis(trifluoromethyl)-4,4'-diaminobiphenyl, 3,3'-bis(trifluoromethyl)-4,4'-diaminobiphenyl, oxy-5,5'-bis[3-(trifluoromethyl)aniline], oxy-4,4'-bis[2-(trifluoromethyl)aniline], oxy-4,4'-bis[3-(trifluoromethyl)aniline], sulfonyl-4,4'-bis[2-(trifluoromethyl)aniline], sulfonyl-4,4'-bis[3-(trifluoromethyl)aniline], 1,3-bis(3-aminophenoxy)-5-(trifluoromethyl)benzene, 1,3-bis[3-amino-5-(trifluoromethyl)phenoxy]benzene, 1,3-bis[3-amino-5-(trifluoromethyl)phenoxy]-5-(trifluoromethyl)benzene, 3,3'-bis(trifluoromethyl)-5,5'-diaminobiphenyl, bis(3-aminophenoxy)dimethylsilane, 1,3-bis(3-aminophenoxy)-1,1,3,3-tetramethyldisiloxane, 1,3-bis(4-aminophenoxy)-1,1,3,3-tetramethyldisiloxane, methanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,2-bis(3-aminopropoxy)ethane, 1,3-diaminocyclohexane, 1,4-diaminecyclohexane, bis(3-aminocyclohexyl)methane, bis(4-aminocyclohexyl)methane, 1,2-bis(3-aminocyclohexyl)ethane, 1,2-bis(4-aminocyclohexyl)ethane, 2,2-bis(3-aminocyclohexyl)propane, 2,2-bis(4-aminocyclohexyl)propane, bis(3-aminocyclohexyl)ether, bis(4-aminocyclohexyl)ether, bis(3-aminocyclohexyl)sulfone, bis(4-aminocyclohexyl)sulfone, 2,2-bis(3-aminocyclohexyl)-1,1,1,3,3,3-hexafluoropropane, 2,2-bis(4-aminocyclohexyl)-1,1,1,3,3,3-hexafluoropropane, 1,3-xylenediamine, 1,4-xylenediamine, 1,8-diaminonaphathalene, 2,7-diaminonaphathalene, 2,6-diaminonaphathalene, 2,5-diaminopyridine, 2,6-diaminopyridine, 2,5-diaminopyrazine, and 2,4-diamino-s-triazine. These diamine compounds can be used singly or in combinations of two or more.

(4) R2

In preparing the polyimide and polyimide precursor of the present invention, various tetracarboxylic dianhydrides containing aliphatic, alicyclic, aromatic or heterocyclic groups can be used. Specific examples of R2 are pyromellitic dianhydride, 3-fluoropyromellitic dianhydride, 3,6-difluoropyromellitic dianhydride, 3-(trifluoromethyl)pyromellitic dianhydride, 3,6-bis(trifluoromethyl)pyromellitic dianhydride, 1,2,3,4-benzentetracarboxylic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 3,3",4,4"-terphenyltetracarboxylic dianhydride, 3,3''',4,4'''-quaterphenyltetracarboxylic dianhydride, 3,3'''',4,4''''-quinoquephenyltetracarboxylic dianhydride, 2,2',3,3'-biphenyltetracarboxylic dianhydride, methylene-4,4'-diphthalic dianhydride, 1,1-ethylidene-4,4'-diphthalic dianhydride, 2,2-propylidene-4,4'-diphthalic dianhydride, 1,2-ethylene-4,4'-diphthalic dianhydride, 1,3-trimethylene-4,4'-diphthalic dianhydride, 1,4-tetramethylene-4,4'-diphthalic dianhydride, 1,5-pentamethylene-4,4'-diphthalic dianhydride, 1,1,1,3,3,3-hexafluoro-2,2- propylidene-4,4'-diphthalic dianhydride, difluoromethylene-4,4'-diphthalic dianhydride, 1,1,2,2-tetrafluoro-1,2-ethylene-4,4'-diphthalic dianhydride, 1,1,2,2,3,3-hexafluoro-1,3-trimethylene-4,4'-diphthalic dianhydride, 1,1,2,2,3,3,4,4-octafluoro-1,4-tetramethylene-4,4'-diphthalic dianhydride, 1,1,2,2,3,3,4,4,5,5-decafluoro-1,3-trimethylene-4,4'-diphthalic dianhydride, oxy-4,4'-diphthalic dianhydride, thio-4,4'-diphthalic dianhydride, sulfonyl-4,4'-diphthalic dianhydride, 1,3-bis(3,4-dicarboxyphenyl)-1,1,3,3-tetramethylsiloxane dianhydride, 1,3-bis(3,4-dicarboxyphenyl)benzene dianhydride, 1,4-bis(3,4-dicarboxyphenyl)benzene dianhydride, 1,3-bis(3,4-dicarboxyphenoxy)benzene dianhydride, 1,4-bis(3,4-dicarboxyphenoxy)benzene dianhydride, 1,3-bis[2-(3,4-dicarboxyphenyl)-2-propyl]benzene dianhydride, 1,4-bis[2-(3,4-dicarboxyphenyl)-2-propyl]benzene dianhydride, bis[3-(3,4-dicarboxyphenoxy)phenyl]methane dianhydride, bis[4-(3,4-dicarboxyphenoxy)phenyl]methane dianhydride, 2,2-bis[3-(3,4-dicarboxyphenoxy)phenyl]propane dianhydride, 2,2-bis[3-(3,4-dicarboxyphenoxy)phenyl]-1,1,1,3,3,3-hexafluoropropane dianhydride, 2,2-bis[4-(3,4-dicarboxyphenoxy)phenyl]-1,1,1,3,3,3-hexafluoropropane dianhydride, bis(3,4-dicarboxyphenoxy)dimethylsilane dianhydride, 1,3-bis(3,4-dicarboxyphenoxy)-1,1,3,3-tetramethyldisiloxane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, 1,3-bis(3,4-dicarboxyphenoxy)-1,1,3,3-tetramethyldisiloxane dianhydride, ethylenetetracarboxylic dianhydride, cyclopentanetetracarboxylic dianhydride, cyclohexane-1,2,3,4-tetracarboxylic dianhydride, cyclohexane-1,2,4,5-tetracarboxylic dianhydride, 3,3',4,4'-bicyclohexyltetracarboxylic dianhydride, carbonyl-4,4'-bis(cyclohexane-1,2-dicarboxylic)dianhydride, methylene-4,4'-bis(cyclohexane-1,2-dicarboxylic) dianhydride, 1,2-ethylene-4,4'-bis(cyclohexane-1,2-dicarboxylic)dianhydride, 1,1-ethylidene-4,4'-bis(cyclohexane-1,2-dicarboxylic)dianhydride, 2,2-propylidene-4,4'-bis(cyclohexane-1,2-dicarboxylic) dianhydride, 1,1,1,3,3,3-hexafluoro-2,2-propylidene-4,4'-bis(cyclohexane-1,2-dicarboxylic)dianhydride, oxy-4,4'-bis(cyclohexane-1,2-dicarboxylic)dianhydride, thio-4,4'-bis(cyclohexane-1,2-dicarboxylic)dianhydride, sulfonyl-4,4'-bis(cyclohexane-1,2-dicarboxylic)dianhydride, 2,2'-difluoro-3,3',4,4'-biphenyltetracarboxylic dianhydride, 5,5'-difluoro-3,3',4,4'-biphenyltetracarboxylic dianhydride, 6,6'-difluoro-3,3',4,4'-biphenyltetracarboxylic dianhydride, 2,2',5,5',6,6'-hexafluoro-3,3',4,4'-biphenyltetracarboxylic dianhydride, 2,2'-bis(trifluoromethyl)-3,3',4,4'-biphenyltetracarboxylic dianhydride, 5,5'-bis(trifluoromethyl)-3,3',4,4'-biphenyltetracarboxylic dianhydride, 6,6'-bis(trifluoromethyl)-3,3',4,4'-biphenyltetracarboxylic dianhydride, 2,2',5,5'-tetrakis(trifluoromethyl)-3,3',4,4'-biphenyltetracarboxylic dianhydride, 2,2',6,6'-tetrakis(trifluoromethyl)-3,3',4,4'-biphenyltetracarboxylic dianhydride, 5,5',6,6'-tetrakis(trifluoromethyl)-3,3',4,4'-biphenyltetracarboxylic dianhydride, 2,2',5,5',6,6'-hexakis(trifluoromethyl)-3,3',4,4'-biphenyltetracarboxylic dianhydride, 3,3'-difluoro-oxy-4,4'-diphathalic dianhydride, 5,5'-difluoro-oxy-4,4'-diphathalic dianhydride, 6,6'-difluoro-oxy-4,4'-diphathalic dianhydride, 3,3',5,5',6,6'-hexafluoro-oxy-4,4'-diphathalic dianhydride, 3,3'-bis(trifluoromethyl)-oxy-4,4'-diphathalic dianhydride, 5,5'-bis(trifluoromethyl)-oxy-4,4'-diphathalic dianhydride, 6,6'-bis(trifluoromethyl)-oxy-4,4'-diphathalic dianhydride, 3,3',5,5'-tetrakis(trifluoromethyl)-oxy-4,4'-diphathalic dianhydride, 3,3',6,6'-tetrakis(trifluoromethyl)-oxy-4,4'-diphathalic dianhydride, 5,5',6,6'-tetrakis(trifluoromethyl)-oxy-4,4'-diphathalic dianhydride, 3,3',5,5',6,6'-hexakis(trifluoromethyl)-oxy-4,4'-diphathalic dianhydride, 3,3'-difluoro-sulfonyl-4,4-diphathalic dianhydride, 5,5'-difluoro-sulfonyl-4,4-diphathalic dianhydride, 6,6'-difluoro-sulfonyl-4,4-diphathalic dianhydride, 3,3',5,5',6,6'-hexafluoro-sulfonyl-4,4-diphathalic dianhydride, 3,3'-bis(trifluoromethyl)-sulfonyl-4,4-diphathalic dianhydride, 5,5'-bis(trifluoromethyl)-sulfonyl-4,4-diphathalic dianhydride, 6,6'-bis(trifluoromethyl)-sulfonyl-4,4-diphathalic dianhydride, 3,3',5,5'-tetrakis(trifluoromethyl)-sulfonyl-4,4-diphathalic dianhydride, 3,3',6,6'-tetrakis(trifluoromethyl)-sulfonyl-4,4-diphathalic dianhydride, 5,5',6,6'-tetrakis(trifluoromethyl)-sulfonyl-4,4-diphathalic dianhydride, 3,3',5,5',6,6'-hexakis(trifluoromethyl)-sulfonyl-4,4-diphathalic dianhydride, 3,3'-difluoro-2,2-perfluoropropylidene-4,4'-diphathalic dianhydride, 5,5'-difluoro-2,2-perfluoropropylidene-4,4'-diphathalic dianhydride, 6,6'-difluoro-2,2-perfluoropropylidene-4,4'-diphathalic dianhydride, 3,3',5,5',6,6'-hexafluoro-2,2-perfluoropropylidene-4,4'-diphathalic dianhydride, 3,3'-bis(trifluoromethyl)-2,2-perfluoropropylidene-4,4'-diphathalic dianhydride, 5,5'-bis(trifluoromethyl)-2,2-perfluoropropylidene-4,4'-diphathalic dianhydride, 6,6'-bis(trifluoromethyl)-2,2-perfluoropropylidene-4,4'-diphathalic dianhydride, 3,3',5,5'-tetrakis(trifluoromethyl)-2,2-perfluoropropylidene-4,4'-diphathalic dianhydride, 3,3',6,6'-tetrakis(trifluoromethyl)-2,2-perfluoropropylidene-4,4'-diphathalic dianhydride, 5,5',6,6'-tetrakis(trifluoromethyl)-2,2-perfluoropropylidene-4,4'-diphathalic dianhydride, 3,3',5,5',6,6'-hexakis(trifluoromethyl)-2,2-perfluoropropylidene-4,4'-diphathalic dianhydride, 9-phenyl-9-(trifluorophenyl)xanthene-2,3,6,7-tetracarboxylic dianhydride, 9,9-bis(trifluorophenyl)xanthene-2,3,6,7-tetracarboxylic dianhydride, and bicyclo[2,2,2]oct-7-ene-2,3,6,7-tetracarboxylic dianhydride. These tetracarbocylic dianhydrides can be used singly or in combination of two or more.

(5) Specific Examples of the Polyimide and Polyimide Precursor (i) In Formula 1 or 2, one example of the polyimide or polyimide precursor has an organic group represented by Formula 13 as R1, an organic group represented by Formula 14 as R3 wherein A represents R4, and an organic group represented by Formula 8 as R4:

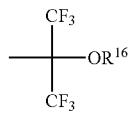

Formula 8

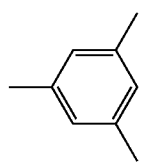

Formula 13

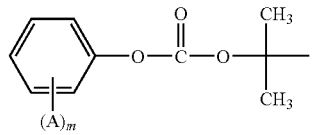

Formula 14

In Formula 14, m represents h which is an integer of 1, 2, 3, 4 or 5.

(ii) In Formula 1 or 2, another example of the polyimide or polyimide precursor has an organic group represented by Formula 13 as R1, an organic group represented by Formula 15 as R3 wherein D represents R4, and an organic group represented by Formula 8 as R4:

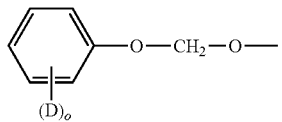

Formula 15

In Formula 15, o represents h which is an integer of 1, 2, 3, 4 or 5.

(iii) In Formula 1 or 2, another example of the polyimide or polyimide precursor has an organic group represented by Formula 13 as R1, an organic group represented by Formula 16 as R3 wherein E represents R4, and an organic group represented by Formula 8 as R4:

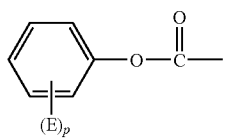

Formula 16

In Formula 16, p represents h which is an integer of 1, 2, 3, 4 or 5.

(iv) Specifically, the polyimide as represented by the Formula 17 can be used as one embodiment of the present invention.

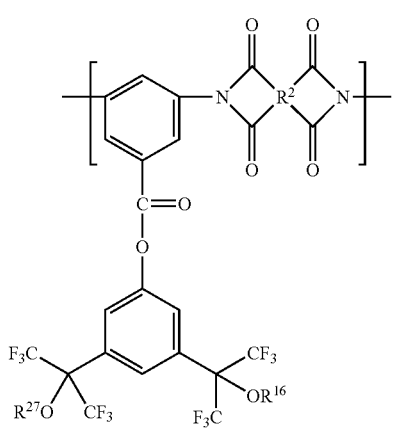

Formula 17

In Formula 17, R16 and R27 independently represent hydrogen, an acid-cleavable group, a base-cleavable group or a crosslinkable group.

The polyimide as represented by Formula 17, per se, is soluble or insoluble in a developer solution, depending on the structures of R16 and R27. However, the alkali solubility of the polyimide is changed when the photosensitive composition is exposed to actinic light. The composition of the present invention can be used as a positive or negative resist material.

(i) In case where at least one of R16 and R27 of the polyimide is hydrogen, the polyimide as represented by Formula 17, per se, is generally soluble in an alkali developer solution. The hydroxyl group of the hexafluoroisopropanol groups is a moiety which imparts solubility in alkali solution. Such a polyimide can be prepared, for example, through the Production Examples 1 to 8 as described later. However, the production method of the polyimide is not limited thereto.

When such a polyimide coexists with a photosensitive additive, the alkali solubility of the polyimide can be decreased. Therefore, the polyimide is insoluble in a developer solution. However, when irradiated with actinic light, the photosensitive additive is changed, and the exposed region can be dissolved in an alkali solution, so that such a photosensitive composition can be provided as a positive resist material.

(ii) In case where at least one of R16 and R27 of the polyimide is an acid-cleavable group, the polyimide as represented by Formula 17, per se, is generally insoluble in an alkali solution. In this case, the photosensitive composition of the present invention generally includes a photoacid generator (PAG). When the photosensitive composition is exposed to actinic light, the photoacid generator generates an acid, which cleaves the acid-cleavable groups such that the polyimide becomes soluble in the alkali solution. Thus, such a photosensitive composition can be provided as a positive resist material.

(iii) When at least one of R16 and R27 of the polyimide is the base-cleavable group, the polyimide as represented by Formula 17, per se, is generally insoluble in an alkali solution. In this case, the photosensitive composition of the present invention generally includes a photobase generator (PBG). When the photosensitive composition is exposed to actinic light, the photobase generator generates a base, which cleaves the base-cleavable groups such that the polyimide becomes soluble in the alkali aqueous solution. Thus, such a photosensitive composition can be provided as a positive resist material.

(iv) When at least one of R16 and R27 of the polyimide is a crosslinkable group, the polyimide as represented by formula 17, per se, is generally soluble in an alkali solution. In this case, the photosensitive composition generally includes a photobase generator (PBG), photoacid generator (PAG), or free radical generator (FRG). When it is exposed to actinic light, the PBG generates a base, the PAG generates an acid, and the FRG generates a free radical which causes crosslinking of the crosslinkable group of the polyimide, such that the polyimide becomes insoluble to the alkali solution. Thus, such a photosensitive composition can be provided as a negative resist material.

(v) R16 and R27 independently represent hydrogen, an acid-cleavable group, a base-cleavable group and a crosslinkable group. R16 can be different from R27. In such a case, the alkali solubility of the polyimide as represented by formula 17 depends on the interaction between the polyimide and the photosensitive additive, and the affinity of the polyimide to the developer solution.

(B) Photosensitive Additives

As explained above, the photosensitive composition of the present invention includes a photosensitive additive. According to the present invention, any photosensitive additives can be used which decrease or increase the solubility of the polyimide or polyimide precursor such that the alkali solubility of the exposed region is differentiated from that of the non-exposed region so as to develop an appropriate pattern.

Depending on the groups of R3, R4 and R5, one or more photosensitive additives can be used such that the alkali solubility of the polyimide and polyimide precursor can be changed by the actinic light irradiation. Generally, distinct photosensitive additives have different absorption wavelengths. Therefore, by using distinct actinic lights corresponding to the photosensitive additives, a pattern can be formed by distinct stages.

Such photosensitive additives can be (i) one which suppresses the alkali solubility of the polyimide or polyimide precursor; (ii) a photoacid generator (PAG); (iii) a free radical generator (FRG); and (iv) a photobase generator (PBG).

(i) Photosensitive Additive which Suppresses the Alkali Solubility of the Polyimide or Polyimide Precursor Generally, the photosensitive additive suppresses the alkali solubility of the polyimide or polyimide precursor. Examples thereof are compounds such as diazonium salts, diazoquinone sulphonamides, diazoquinone sulphonic acid esters, diazoquinone sulphonates, nitrobenzyl esters, onium salts, halides, halogenated isocyanates, triazine halides, bisarylsulphonyldiazomethanes, disulphones and the like. In particular, o-diazoquinone (o-quinone diazides), and more in particular, o-diazonaphthoquinones (DNQ, o-naphthoquinone diazides) can be generally used, because these compounds are effective in suppressing alkali solubility. However, when actinic light is irradiated, an alkali soluble moiety is formed. Therefore, the exposed region becomes soluble in an alkali solution, whereas the non-exposed region is still insoluble in the alkali solution.

The o-diazoquinones (o-quinone diazides) can be obtained, for example, by condensation reaction of an o-quinonediazide sulphonyl chloride with a polyhydroxy compound, a polyamine compound or a polyhydroxy polyamine compound.

The o-Quinonediazide sulphonyl chlorides can include 1,2-benzoquinone-2-azido-4-sulphonyl chloride, 1,2-naphthoquinone-2-diazido-5-sulphonyl chloride, 1,2-naphthoquinone-2-diazido-6-sulphonyl chloride and 1,2-naphthoquinone-2-diazido-4-sulphonyl chloride.

The polyhydroxy compounds can include hydroquinone, resorcinol, pyrogallol, bisphenol A, bis(4-hydroxyphenyl) methane, 2,2-bis(4-hydroxyphenyl)hexafluoropropane, 2,3,4-trihydroxybenzophenone, 2,3,4-trihydroxy diphenyl methane, 2,3,4,4'-tetrahydroxy diphenyl methane 2,3,4,4'-tetrahydroxybenzophenone, 2,2',4,4'-tetrahydroxybenzophenone, tris(4-hydroxyphenyl)methane, 1,1,1-tris(4-hydroxyphenyl)ethane, 1-[1-(4-hydroxyphenyl)isopropyl]-4-[1,1-bis(4-hydroxyphenyl)ethyl]benzene, 1-naphthol, 2-naphthol, methyl gallate and ethyl gallate.

The polyamine compounds can include 1,4-phenylenediamine, 1,3-phenylenediamine, 4,4'-diaminodiphenyl ether, 4,4'-diaminodiphenylmethane, 4,4'-diaminodiphenylsulphone and 4,4'-diaminodiphenylsulphide.

The polyhydroxy polyamine compounds can include 2,2-bis(3-amino-4-hydroxyphenyl)hexafluoropropane and 3,3-dihydroxybenzidine.

Specific examples of the o-diazoquinones are 1,2-benzoquinone-2-azido-4-sulphonate ester or sulphonamide, 1,2-naphthoquinone-2-diazido-5-sulphonate ester or sulphonamide, and 1,2-naphthoquinone-2-diazido-4-sulphonate ester or sulphonamide.

The photosensitive additive (i) can be included in the photosensitive composition of the present invention at an amount of 0.01 to 40 wt % with respect to total solids in one embodiment, or at an amount of 5 to 30 wt % with respect to total solids in another embodiment, or at an amount of 15 to 25 wt % with respect to total solids in yet another embodiment.

(ii) Photoacid Generator (PAG)

In the present invention, the photoacid generator generates an acid when it is exposed to actinic light. The photoacid generator useful in the present invention can be onium salts, sulfonate ester, or disulfonyldiazomethanes. These photoacid generators can be included alone or in combination thereof. The photoacid generator can be included in the photosensitive composition of the present invention at an amount of 0.01 to 20 wt % with respect to total solids in one embodiment, or at an amount of 1 to 10 wt % with respect to total solids in another embodiment, or at an amount of 3 to 7 wt % with respect to total solids in yet another embodiment.

(iii) Photobase Generator (PBG)

In the present invention, the photobase generator generates a base when it is exposed to actinic light. The examples of the photobase generator are cobalt amine complexes as represented by $Co(III)(RNH_2)_5X^{2+}$, wherein R represents hydrogen or an alkyl group having a carbon number of 1 or more, and X represents $Br^-$ and $Cr^-$. Other examples of the photobase generators are oxime esters, carbamic acids, nitrobenzyl sulfonamides, and quaternary ammonium salts but not to be limited thereto. These photobase generators can be included alone or in combination thereof. The photobase generator can be included in the photosensitive composition of the present invention at an amount of 0.01 to 20 wt % with respect to total solids in one embodiment, or at an amount of 1 to 10 wt % in another embodiment, or at an amount of 3 to 7 wt % with respect to total solids in yet another embodiment.

(iv) Free Radical Generator (FRG)

The free radical generator generates a radical when it is exposed to actinic light. The examples of the free radical generators are benzoin ethers, benzyl derivatives, trichlorotriazines, and phosphine oxides, but not to be limited thereto. These free radical generators can be included alone or in combination thereof. The free radical generator can be included in the photosensitive composition of the present invention at an amount of 0.01 to 20 wt % with respect to total solids in one embodiment, or at an amount of 1 to 10 wt % with respect to total solids in another embodiment, or at an amount of 3 to 7 wt % with respect to total solids in yet another embodiment.

(C) Photosensitizer

A photosensitizer can be further included in the photosensitive composition of the present invention. If the photosensitive composition as prepared is transparent to the wavelength of the actinic light, a photosensitizer is useful. The photosensitizer can receive the energy of the actinic light, which can be transferred to the photosensitive additive of the present invention. Thus, using the photosensitizer enhances the choice of the photosensitive additives which can be used in the present invention. Examples of the photosensitizer are aromatic compounds such as naphthalenes, anthracenes and pyrenes; carbazole derivatives, aromatic carbonyl compounds, benzophenone derivatives, thioxanthone derivatives and coumarin derivatives. In particular, specific examples of the photosensitizers are 1-methylnaphthalene, 2-methylnaphthalene, 1-fluoronaphthalene, 1-chloronaphthalene, 2-chloronaphthalene, 1-bromonaphthalene, 2-bromonaphthalene, 1-iodinenaphthalene, 2-iodinenaphthalene, 1-naphthol, 2-naphthol, 1-methoxynaphthalene, 2-methoxynaphthalene, 1,4-dicyanonaphthalene, anthracene, 1,2-benzanthracene, 9,10-dichloroanthracene, 9,10-dibromoanthracene, 9,10-diphenyl anthracene, 9-cyanoanthracene, 9,10-dicyanoanthracene, 2,6,9,10-tetracyanoanthracene, carbazole, 9-methylcarbazole, 9-phenylcarbazole, 9-propyl-9H-carbazole, 9-vinylcarbazole, 9H-carbazole-9-ethanol, 9-methyl-3-nitro-9H-carbazole, 9-methyl-3,6-dinitro-9H-carbazole, 9-carbazole methanol, 9-carbazole propionic acid, 9-decyl-3,6-dinitro-9H-carbazole, 9-ethyl-3,6-dinitro-9H-carbazole, 9-ethyl-3-nitrocarbazole, 9-ethylcarbazole, 9-isopropylcarbazole, 9-(ethoxycarbonylmethyl) carbazole, 9-(morpholinomethyl)carbazole, 9-acetylcarbazole, 9-arylcarbazole, 9-benzyl-9Hcarbazole, 9-carbazole acetic acid, 9-(2-nitrophenyl) carbazole, 9-(4-methoxyphenyl)carbazole, 9-(1-ethoxy-2-methyl-propyl)-9H-carbazole, 3-nitrocarbazole, 4-hydroxycarbazole, 3,6-dinitro-9H-carbazole, 3,6-diphenyl-9H-carbazole, 2-hydroxycarbazole, 3,6-diacetyl-9-ethylcarbazole, benzophenone, 4-phenylbenzophenone, 4,4'-bis(dimethoxy) benzophenone, 4,4'-bis(dimethylamino)benzophenone, 4,4'-bis(diethylamino) benzophenone, 2-benzoylbenzoic acid methyl ester, 2-methylbenzophenone, 3-methylbenzophenone, 4-methylbenzophenone, 3,3'-dimethyl-4-methoxybenzophenone, 2,4,6-trimethylbenzophenone, [4-(4-methylphenylthio)phenyl]-phenylmethanone, xanthone, thioxanthone, 2-chlorothioxanthone, 4-chloro thioxanthone, 2-isopropyl thioxanthone, 4-isopropyl thioxanthone, 2,4-dimethyl thioxanthone, 2,4-diethyl thioxanthone and 1-chloro-4-propoxy thioxanthone. The photosensitizer can be included alone or in combination thereof. The photosensitizer can be included at an amount of 0.01 to 20 wt % with respect to total solids in one embodiment, or at an amount of 0.1 to 10 wt % with respect to total solids in another embodiment.

(D) Thermal Acid Generator (TAG)

The thermal acid generator generates an acid when it is exposed to heat. According to the present invention, the thermal acid generator (TAG) substantially does not generate an acid when it is exposed to a light. After development of the image, it is heated and the TAG generates acid which in turn assists in the cleavage of the acid-cleavable group. Examples of the thermal acid generator are halogenoid nitrogen containing compounds which generate a halogen radical when being exposed to an infrared light and sulfonate esters including nitrobenzyl sulfonates, but not to be limited thereto. These thermal acid generators can be included alone or in combination thereof. The thermal acid generator can be included in the photosensitive composition of the present invention at an amount of 0.01 to 20 wt % with respect to total solids in one embodiment, or at an amount of 1 to 10 wt % with respect to total solids in another embodiment, or at an amount of 3 to 7 wt % with respect to total solids in yet another embodiment.

(E) Crosslinker

A crosslinker can be further added to the photosensitive composition of the present invention. The crosslinker causes crosslinking reaction such that the exposed region becomes insoluble in the alkali solution. When the acid-cleavable group, base-cleavable group, thermal cleavable group and/or hydrophilic group remain after forming the relief pattern, the crosslinker can be useful because the crosslinker can react with these groups. The reaction by the crosslinker can modify the properties of the relief pattern, such as tensile strength thereof. For example, if a hydrophilic group such as hydroxyl group or carboxyl group is generated at the portion where R3 is cleaved off, the crosslinker can react with the generated hydrophilic group, so as to cause the crosslinking reaction. The crosslinker can include compounds which have two or more epoxy groups, vinyl ether groups, acrylate, methacrylate, methylol groups or alkoxymethyl groups. Examples of the crosslinkers are bisphenol A epoxy resins, bisphenol F epoxy resins, bisphenol AD epoxy resins, cresol novolac epoxy resins, phenol novolac epoxy resins, glycidyl amine epoxy resins, polysulfide epoxy resins, dimethylol ureas, alkoxy methyl melamines and so on. According to the present invention, the crosslinker means a compound which is different from the crosslinkable group included in the polyimide as mentioned above. The crosslinker can be added into the photosensitive composition. The crosslinker can be included at an amount of 0.01 to 40 wt % with respect to total solids in one embodiment, or at an amount of 0.1 to 20 wt % with respect to total solids in another embodiment, in the photosensitive composition.

(F) Solvent

A solvent can be added in order to dissolve or homogenously disperses the components of the present invention. Specific examples of the solvents are propylene glycol methylether acetate, N-methyl-2-pyrrolidone, N,N-dimethylformamide, N,N-dimethylacetamide, dimethylsulphoxide, 1,3-dimethylimidazolidinone, hexamethylphosphoramide and γ-butyrolactone. Other solvents such as isopropanol, ethanol, methanol, water, tetrahydrofuran, propylene glycol monomethyl ether acetate, propylene glycol monomethyl ether, ethyl lactate and diethyl adipate can be also used. The solvents as mentioned above can be used alone or in combinations.

(G) Method (i) Forming Pattern

Using the photosensitive composition of the present invention, a relief pattern can be formed as follows. First, the photosensitive composition is applied onto a substrate of e.g., a silicon wafer, a ceramic or gallium arsenide. The photosensitive composition can be applied by using a spinner, spray application or roller coating. Generally, the photosensitive composition is applied such that the photosensitive composition film after being dried has a thickness from 0.1 μm to 150 μm. The drying process can be generally carried out at a temperature of 50° C. to 150° C. for a period of 1 minute to several hours.

Then, the photosensitive composition film is exposed to actinic light radiation. Upon irradiation, a mask with desired patterns can be used. Use of a laser beam via a direct write process can eliminate the process of applying the mask. By exposing the photosensitive composition film to actinic light, the alkali solubility of the polyimide or polyimide precursor can be differentiated between the exposed portion and the non-exposed portion. Generally, an actinic light can be selected which has a wavelength sensitive to the photosensitive additive. Examples of the actinic lights are ultraviolet light, far ultraviolet light, infrared light, an electron beam, X-rays and the like. For example, KrF line (248 nm), 1-line (365 nm), h-line (405 nm) and g-line (436 nm) can be used.

In the case of a positive-acting composition, after the irradiation, the exposed regions are removed by dissolving them in an alkaline solution, that is, a developer solution. In the case of a negative-acting composition, after the irradiation, the non-exposed regions are removed by dissolving them in an alkaline solution. The developer solution can be an alkali solution or alkali aqueous solution which includes a base component such astetramethylammonium hydroxide (TMAH), diethanolamine, diethylaminoethanol, sodium hydroxide, potassium hydroxide, sodium carbonate, potassium carbonate, triethylamine, diethylamine, methylamine, dimethyl amine, dimethylaminoethyl acetate, dimethylaminoethanol, cyclohexylamine, ethylenediamine and hexamethylenediamine. If necessary, the developer solution can further include polar solvents such as N-methyl-2-pyrrolidone, N,N-dimethylformamide, N,N-dimethylacetamide, dimethylsulphoxide, γ-butyrolactone and dimethylacrylamide; alcohols such as methanol, ethanol and isopropanol; esters such as ethyl lactate and propylene glycol monomethyl ether acetate; and ketones such as cyclopentanone, cyclohexanone, isobutyl ketone and methyl isobutyl ketone. These solvents can be added alone or in combination thereof. After development, the developed pattern is generally rinsed with water.

(ii) Thermal Process (a) Polyimide

Then, the developed pattern including a polyimide is subjected to a thermal process. The polyimide includes an acid-cleavable group or a thermally cleavable group as R3, so that the groups of R3 and R4 can be removed after developing the pattern. The temperature of the thermal process depends on the feature of the group R3, and the presence of thermal acid generator.

The polyimide containing an acid-cleavable pendant group as R3 and TAG are included in the developed pattern, R3 can be cleaved at a temperature between 50 and 180° C. in one embodiment, and at a temperature between 80 and 130° C. in another embodiment. If the polyimide contains a thermally-cleavable group as R3, R3 can be cleaved at a temperature between 100 and 350° C. in one embodiment, and at a temperature between 120 and 270° C. in another embodiment.

(b) Polyimide Precursor

Unlike using the polyimide, the developed pattern containing a polyimide precursor is subjected to another thermal process. The polyimide precursor is heated at a temperature of 320 to 350° C. to converting the polyamic acid into a polyimide. If the polyimide precursor contains a thermally cleavable group as R3, it can be cleaved at the same time of this conversion. If the polyimide precursor includes an acid-cleavable group, some of the groups can be cleaved at the time of the converting. The acid-cleavable group, R3, can also be cleaved by the action of an acid or base, at a different stage from this conversion.

(H) Various Embodiments of Photosensitive Compositions

In accordance with the present invention, various embodiments of the photosensitive composition can be provided depending on the use. Examples of the present invention are described in Tables 1 and 2.

Embodiment No. 1 includes a polyimide represented by Formula 1 wherein R3 is a thermally-cleavable group and R4 is a hydrophilic group; and a diazonaphthoquinone, which can be patternable by using I line (wavelength: 365 nm) or KrF (wavelength: 248 nm.

Embodiment No. 2 includes a polyimide represented by Formula 1 wherein R3 is an acid-cleavable group and R4 is a hydrophilic group; a diazonaphthoquinone and PAG. The diazonaphthoquinone decreases the alkali solubility, which can be patternable by I line. After developing a pattern, it can be irradiated a second time to cause the PAG to generate an acid so as to cleave R3.

Embodiment No. 3 includes a polyimide represented by Formula 1 wherein R3 is a base-cleavable group and R4 is a hydrophilic group. It also includes a diazonaphthoquinone (DNQ) and PBG. The DNQ decreases the alkali solubility, which can be patternable by I line. After developing a pattern, it can be irradiated a second time to cause the PBG to generate a base so as to cleave R3.

Embodiment No. 4 includes a polyimide represented by Formula 1 wherein R3 is a thermally-cleavable group and R4 is a hydrophilic group partially or wholly protected by an acid-cleavable group. It also includes a PAG, and it can include a photosensitizer, if necessary. The polyimide is insoluble to a developer solution, but when I line or KrF line is irradiated, the exposed region can be soluble by the action of PAG. The developed pattern is heated to cleave the thermally-cleavable group of R3.

Embodiment No. 5 includes a polyimide represented by Formula 1 wherein R3 is a thermally-cleavable group and R4 is a hydrophilic group partially or wholly protected by a crosslinkable group. It also includes a PBG, and it can include a crosslinker and a photosensitizer, if necessary. The polyimide is soluble to a developer solution, but by irradiating I line or KrF line, the exposed region can become insoluble by causing the crosslinking of the polymer. After developing a pattern, it can be heated to cleave the thermally-cleavable group of R3, if necessary. The thermally-cleavable group of R3 can remain in the relief pattern.

Embodiment No. 6 includes a polyimide represented by Formula 1 wherein R3 is a thermally-cleavable group and R4 is a hydrophilic group partially or wholly protected by a crosslinkable group. It also includes a PAG, and it can include a crosslinker and a photosensitizer, if necessary. The polyimide is soluble to a developer solution, but by irradiating I-line or KrF-line, the exposed region can become insoluble by causing the crosslinking of the polymer. After developing a pattern, it can be heated to cleave the thermally-cleavable group of R3, if necessary. The thermally-cleavable group of R3 can remain in the relief pattern.

Embodiment No. 7 includes a polyimide represented by Formula 1 wherein R3 is a thermally-cleavable group and R4 is a hydrophilic group partially or wholly protected by a base-cleavable group. It also includes a PBG, and it can include a crosslinker and a photosensitizer, if necessary. The polyimide is insoluble in a developer solution, but by irradiating I-line or KrF-line, the exposed region can be solubilized by the action of the PBG. After developing a pattern, it is heated so as to cleave the thermally-cleavable group of R3.

Embodiment No. 8 includes a polyimide represented by Formula 1 wherein R3 is an acid-cleavable group and R4 is a hydrophilic group. It also includes a DNQ and TAG, and it can include a crosslinker and a photosensitizer, if necessary. The polyimide is insoluble to a developer solution, but by irradiating I-line or KrF-line, the exposed region can become soluble by the action of DNQ. The developed relief pattern is heated to cleave the acid-cleavable group of R3 by the action of TAG.

Embodiment No. 9 includes a polyimide represented by Formula 1 wherein R3 is a thermally-cleavable group and R4 is a hydrophilic group partially or wholly protected by an acid-cleavable group. It also includes a PBG and TAG, and it can include a crosslinker and a photosensitizer, if necessary. The polyimide is insoluble to a developer solution. By irradiating I-line or KrF-line, the PBG in the exposed region generates a base, which is then quenched by an acid generated there from the TAG upon heating. In the non-exposed region, the acid generated from the TAG upon heating cleaves the acid-cleavable group of R4. After developing a pattern, the thermally cleavable group can be cleaved, if necessary.

Embodiment No. 10 includes a polyimide represented by formula 1 wherein R3 is an acid-cleavable group and R4 is a hydrophilic group partially or wholly protected by a crosslinkable group. It also includes a PBG and TAG, and it can include a crosslinker and a photosensitizer, if necessary. The polyimide is soluble to a developer solution. By irradiating I-line or KrF-line, the PBG in the exposed region generates a base, which is then quenched by an acid generated there from the TAG upon heating. In the non-exposed region, the acid generated from the TAG upon heating causes crosslinking. The developed pattern can be heated to cleave the acid-cleavable group of R3, if necessary. The acid-cleavable group of R3 can remain in the relief pattern.

Embodiment No. 11 includes a polyimide represented by Formula 1 wherein R3 is a thermally-cleavable group and R4 is a hydrophilic group partially or wholly protected by a crosslinkable group. It also includes a PBG and TAG, and it can include a crosslinker and a photosensitizer, if necessary. The polyimide is soluble to a developer solution. By irradiating I-line or KrF-line, the PBG in the exposed region generates a base, which is then quenched by the acid generated there from the TAG. In the non-exposed region, the acid generated from the TAG upon heating causes crosslinking. The developed pattern can be heated to cleave the thermally-cleavable group of R3, if necessary. The thermally-cleavable group of R3 can remain in the relief pattern.

Embodiment No. 12 includes a polyimide represented by Formula 1 wherein R3 is an acid-cleavable group and R4 is a hydrophilic group. It also includes a PAG, and it can include a photosensitizer, if necessary. The polyimide is soluble to a developer solution. By irradiating I-line or KrF-line, the exposed region is rendered insoluble in a developer solution. The developed pattern can be heated to cleave the acid-cleavable group of R3, if necessary. The acid-cleavable group of R3 can remain in the relief pattern.

Embodiment No. 13 includes a polyimide represented by Formula 1 wherein R3 is a base-cleavable group and R4 is a hydrophilic group. It also includes a PBG, and it can include a photosensitizer, if necessary. The polyimide is soluble in a developer solution. By irradiating I-line or KrF-line, the exposed region is rendered insoluble in a developer solution. The developed pattern can be heated to cleave the base-cleavable group of R3, if necessary. The base-cleavable group of R3 can remain in the relief pattern.

Embodiment No. 14 includes a polyimide represented by Formula 1 wherein R3 is a thermally-cleavable group and R4 is a hydrophilic group partially or wholly protected by a crosslinkable group. It also includes an FRG, and it can include a photosensitizer, if necessary. The polyimide is soluble in a developer solution. By irradiating I-line or KrF-line, the exposed region can become insoluble by causing the crosslinking of the polymer. The developed pattern can be heated to cleave the thermally-cleavable group of R3, if necessary. The thermally-cleavable group of R3 can remain in the relief pattern.

Embodiment No. 15 includes a polyimide represented by Formula 1 wherein R3 is an acid-cleavable group and R4 is a hydrophilic group partially or wholly protected by a crosslinkable group. It also includes an FRG and a TAG, and it can include a photosensitizer, if necessary. The polyimide is soluble in a developer solution. By irradiating I-line or KrF-line, the exposed region can become insoluble by causing the crosslinking of the polymer. The developed pattern can be heated to cleave the acid-cleavable group of R3, if necessary. The acid-cleavable group of R3 can remain in the relief pattern.

Embodiment No. 16 includes a polyimide represented by Formula 1 wherein R3 is an acid-cleavable group and R4 is a hydrophilic group partially or wholly protected by a base-cleavable group. It also includes a PBG and TAG, and it can include a crosslinker and a photosensitizer, if necessary. The polyimide is insoluble in a developer solution, but by irradiating I-line or KrF-line, the exposed region can be solubilized by the action of the PBG. After developing a pattern, it is heated so as to cleave the acid-cleavable group of R3.

TABLE 1

| | Photosensitive composition | | | | | | | | |
|---|---|---|---|---|---|---|---|---|---|
| | Polyimide represented by Formula 1 | | | | | | | | |
| | R3 | | | | R4 | | | | |
| No. | Acid-cleavable group | base-cleavable group | thermally-cleavable group | hydrophilic group | hydrophilic group protected by acid-cleavable group | hydrophilic group protected by base-cleavable group | hydrophilic group protected by crosslinkable group | Active Compound[1] | Exposure light[2] | Positive/Negative[3] |
| 1 | | | x | x | | | | DNQ | I or KrF | p |
| 2 | X | | | x | | | | DNQ + PAG | I + KrF | p |
| 3 | | x | | x | | | | DNQ + PBG | I + KrF | p |
| 4 | | | x | | x | | | PAG | I or KrF | p |
| 5 | | | x | | | | x | PBG | I or KrF | n |
| 6 | | | x | | | | x | PAG | I or KrF | n |
| 7 | | | x | | | x | | PBG | I or KrF | p |
| 8 | X | | | x | | | | DNQ + TAG | I or KrF | p |
| 9 | | | x | | x | | | PBG + TAG | I or KrF | n |
| 10 | X | | | | | | x | PBG + TAG | I or KrF | p |
| 11 | | | x | | | | x | PBG + TAG | I or KrF | p |
| 12 | x | | | x | | | | PAG | I or KrF | n |
| 13 | | x | | x | | | | PBG | I or KrF | n |
| 14 | | | x | | | | x | FRG | I or KrF | n |

TABLE 1-continued

| | Photosensitive composition | | | | | | | | | |
|---|---|---|---|---|---|---|---|---|---|---|
| | Polyimide represented by Formula 1 | | | | | | | | | |
| | R3 | | | R4 | | | | | | |
| No. | Acid-cleavable group | base-cleavable group | thermally-cleavable group | hydrophilic group | hydrophilic group protected by acid-cleavable group | hydrophilic group protected by base-cleavable group | hydrophilic group protected by crosslinkable group | Active Compound[1] | Exposure light[2] | Positive/Negative[3] |
| 15 | x | | | | | | x | FRG + TAG | I or KrF | n |
| 16 | x | | | | | x | | PBG + TAG | I or KrF | p |

[1]DNQ represents a diazonaphthoquinone compound, PAG represents a photo-acid generator, PBG represents a photo-base generator, TAG represents a thermal acid generator, FRG represents a free radical generator.
[2]I represents an actinic light having wavelength of 365 nm, KrF represents an actinic light having wavelength of 248 nm.
[3]Lower-case letter p represents a positive-acting composition, and lower-case letter n represents a negative-acting composition.

Table 2 shows various embodiments using the polyimide precursor of the present invention.

Embodiment No. 17 includes a polyimide precursor represented by Formula 2 wherein R4 is a hydrophilic group, R3 is a thermally-cleavable group, and R5 is an acid-cleavable group. It also includes a DNQ, and it can include a crosslinker and a photosensitizer, if necessary. The composition can be patterned by irradiating I-line or KrF-line. The developed pattern can be heated to cleave the thermally-cleavable group of R3, if necessary. The thermally-cleavable group of R3 can remain in the relief pattern.

Embodiment No. 18 includes a polyimide precursor represented by Formula 2 wherein R4 is a hydrophilic group, R3 is an acid-cleavable group, and R5 is an acid-cleavable group. It also includes a DNQ and PAG, and it can include a crosslinker and a photosensitizer, if necessary. The DNQ decreases the alkali solubility of the polyimide precursor, and can be patterned by I-line irradiation. The developed pattern can be heated to cleave the acid-cleavable group of R3, if necessary. After developing a pattern, it can be irradiated a second time to cause the PAG to generate an acid so as to cleave R3.

Embodiment No. 19 includes a polyimide precursor represented by Formula 2 wherein R4 is a hydrophilic group, R3 is a base-cleavable group, and R5 is an acid-cleavable group. It also includes a DNQ and PBG, and it can include a crosslinker and a photosensitizer, if necessary. The DNQ decreases the alkali solubility of the polyimide precursor, and can be patterned by I-line irradiation. The developed pattern can be heated to cleave the base-cleavable group of R3, if necessary. After developing a pattern, it can be irradiated a second time to cause the PBG to generate a base so as to cleave R3.

Embodiment No. 20 includes a polyimide precursor represented by Formula 2 wherein R4 is a hydrophilic group partially or wholly protected by an acid cleavable group, R3 is a thermally-cleavable group, and R5 is an acid-cleavable group. It also includes a PAG, and it can include a crosslinker and a photosensitizer, if necessary. The composition can be patterned by irradiating I-line or KrF-line. The developed pattern can be heated to cleave the thermally-cleavable group of R3, if necessary. The thermally-cleavable group of R3 can remain in the relief pattern.

Embodiment No. 21 includes a polyimide precursor represented by Formula 2 wherein R4 is a hydrophilic group partially or wholly protected by a base cleavable group, R3 is a thermally-cleavable group, and R5 is an acid-cleavable group. It also includes a PBG, and it can include a crosslinker and a photosensitizer, if necessary. The composition can be patterned by irradiating I-line or KrF-line. The developed pattern can be heated to cleave the thermally-cleavable group of R3, if necessary. The thermally-cleavable group of R3 can remain in the relief pattern.

Embodiment No. 22 includes a polyimide precursor represented by Formula 2 wherein R4 is a hydrophilic group, R3 is an acid-cleavable group, and R5 is an acid-cleavable group. It also includes DNQ and TAG and it can include a crosslinker and a photosensitizer, if necessary. The DNQ decreases the alkali solubility of the polyimide precursor, and can be patterned by I-line or KrF-line irradiation. The developed pattern can be heated to cleave the acid-cleavable group of R3 by action of the TAG.

Embodiment No. 23 includes a polyimide precursor represented by Formula 2 wherein R4 is a hydrophilic group partially or wholly protected by a acid cleavable group, R3 is a thermally-cleavable group, and R5 is an acid-cleavable group. It also includes a PBG and TAG, and it can include a crosslinker and a photosensitizer, if necessary. The polyimide precursor is insoluble to a developer solution. By irradiating I-line or KrF-line, the PBG in the exposed region generates a base, which is then quenched by an acid generated there from the TAG upon heating. In the non-exposed region, the acid generated from the TAG upon heating cleaves the acid-cleavable group of R4. After developing a pattern, the thermally cleavable group of R3 can be cleaved, if necessary.

Embodiment No. 24 includes a polyimide precursor represented by Formula 2 wherein R3 is a thermally-cleavable group, R4 is a hydrophilic group partially or wholly protected by a crosslinkable group, and R5 is an acid-cleavable group. It also includes a PBG and TAG, and it can include a crosslinker and a photosensitizer, if necessary. The polyimide precursor is soluble to a developer solution. By irradiating I-line or KrF-line, the PBG in the exposed region generates a base, which is then quenched by the acid from the TAG upon heating. In the non-exposed region, the acid generated from the TAG upon heating causes crosslinking. The developed pattern can be heated to cleave the thermally-cleavable group of R3, if necessary. The thermally-cleavable group of R3 can remain in the relief pattern.

Embodiment No. 25 includes a polyimide precursor represented by Formula 2 wherein R3 is a thermally-cleavable group, R4 is a hydrophilic group partially or wholly protected by a crosslinkable group, and R5 is an acid-cleavable group. It also includes a FRG, and it can include a photosensitizer, if necessary. The polyimide precursor is soluble in a developer solution. By irradiating I-line or KrF-line, the exposed region can become insoluble by causing the crosslinking of the polymer. The developed pattern can be heated to cleave the thermally-cleavable group of R3, if necessary. The thermally-cleavable group of R3 can remain in the relief pattern.

Embodiment No. 26 includes a polyimide precursor represented by Formula 2 wherein R3 is an acid-cleavable group, R4 is a hydrophilic group partially or wholly protected by a crosslinkable group, and R5 is an acid-cleavable group. It also includes an FRG and a TAG, and it can include a photosensitizer, if necessary. The polyimide precursor is soluble in a developer solution. By irradiating I-line or KrF-line, the exposed region can become insoluble by causing the crosslinking of the polymer. The developed pattern can be heated to cleave the acid-cleavable group of R3 by action of the TAG, if necessary. The acid-cleavable group of R3 can remain in the relief pattern.

Embodiment No. 27 includes a polyimide precursor represented by Formula 2 wherein R3 is a thermally-cleavable group, R4 is a hydrophilic group partially or wholly protected by a crosslinkable group, and R5 is an acid-cleavable group. It also includes a PAG, and it can include a crosslinker and a photosensitizer, if necessary. The polyimide precursor is soluble to a developer solution, but by irradiating I line or KrF line, the exposed region can become insoluble by causing the crosslinking of the polymer. After developing a pattern, it can be heated to cleave the thermally-cleavable group of R3, if necessary. The thermally-cleavable group of R3 can also remain in the relief pattern.

Embodiment No. 28 includes a polyimide precursor represented by Formula 2 wherein R3 is a thermally-cleavable group, R4 is a hydrophilic group partially or wholly protected by a crosslinkable group, and R5 is an acid-cleavable group. It also includes a PBG, and it can include a crosslinker and a photosensitizer, if necessary. The polyimide precursor is soluble to a developer solution, but by irradiating I-line or KrF-line, the exposed region can become insoluble by causing the crosslinking of the polymer. After developing a pattern, it can be heated to cleave the thermally-cleavable group of R3, if necessary. The thermally-cleavable group of R3 can also remain in the relief pattern.

Embodiment No. 29 includes a polyimide precursor represented by Formula 2 wherein R3 is an acid-cleavable group, R4 is a hydrophilic group partially or wholly protected by a crosslinkable group, and R5 is an acid-cleavable group. It also includes a PBG and TAG, and it can include a crosslinker and a photosensitizer, if necessary. The polyimide precursor is soluble to a developer solution. By irradiating I-line or KrF-line, the PBG in the exposed region generates a base, which is then quenched by the acid generated from the TAG. In the non-exposed region, the acid generated from the TAG upon heating causes crosslinking. The developed pattern can be heated to cleave the acid-cleavable group of R3 by action of the TAG, if necessary. The acid-cleavable group of R3 can remain in the relief pattern.

Embodiment No. 30 includes a polyimide precursor represented by Formula 2 wherein R3 is a base-cleavable group, R4 is a hydrophilic group, and R5 is an acid-cleavable group. It also includes a PBG, and it can include a photosensitizer, if necessary. The polyimide precursor is soluble in a developer solution. By irradiating I-line or KrF-line, the exposed region is rendered insoluble in a developer solution. The developed pattern can be heated to cleave the base-cleavable group of R3, if necessary. The base-cleavable group of R3 can remain in the relief pattern.

Embodiment No. 31 includes a polyimide precursor represented by Formula 2 wherein R3 is an acid-cleavable group, R4 is a hydrophilic group partially or wholly protected by a base-cleavable group, and R5 is an acid-cleavable group. It also includes a PBG and TAG, and it can include a crosslinker and a photosensitizer, if necessary. The polyimide precursor is insoluble in a developer solution, but by irradiating I-line or KrF-line, the exposed region can be solubilized by the action of the PBG. After developing a pattern, it is heated so as to cleave the acid-cleavable group of R3 by the action of the TAG.

Embodiment No. 32 includes a polyimide precursor represented by Formula 2 wherein R4 is a hydrophilic group, R3 is a thermally-cleavable group, and R5 is hydrogen. It also includes a DNQ, and it can include a crosslinker and a photosensitizer, if necessary. The composition can be patterned by irradiating I-line or KrF-line. The developed pattern can be heated to cleave the thermally-cleavable group of R3, if necessary. The thermally-cleavable group of R3 can remain in the relief pattern.

Embodiment No. 33 includes a polyimide precursor represented by Formula 2 wherein R4 is a hydrophilic group, R3 is an acid-cleavable group, and R5 is hydrogen. It also includes a DNQ and PAG, and it can include a crosslinker and a photosensitizer, if necessary. The DNQ decreases the alkali solubility of the polyimide precursor, and can be patterned by I-line irradiation. The developed pattern can be heated to cleave the acid-cleavable group of R3, if necessary. After developing a pattern, it can be irradiated a second time to cause the PAG to generate an acid so as to cleave R3.

Embodiment No. 34 includes a polyimide precursor represented by Formula 2 wherein R4 is a hydrophilic group, R3 is a base-cleavable group, and R5 is hydrogen. It also includes a DNQ and PBG, and it can include a crosslinker and a photosensitizer, if necessary. The DNQ decreases the alkali solubility of the polyimide precursor, and can be patterned by I-line irradiation. The developed pattern can be heated to cleave the base-cleavable group of R3, if necessary. After developing a pattern, it can be irradiated a second time to cause the PBG to generate a base so as to cleave R3.

Embodiment No. 35 includes a polyimide precursor represented by Formula 2 wherein R4 is a hydrophilic group partially or wholly protected by an acid cleavable group, R3 is a thermally-cleavable group, and R5 is hydrogen. It also includes a PAG, and it can include a crosslinker and a photosensitizer, if necessary. The polyimide precursor should be insoluble to a developer solution. The precursor can be designed to be insoluble to the alkali developer solution, or alternatively, the concentration of the base component of the developer solution can be significantly low, e.g., 0.1N or less. The composition can be patterned by irradiating I-line or KrF-line. The developed pattern can be heated to cleave the thermally-cleavable group of R3, if necessary. The thermally-cleavable group of R3 can remain in the relief pattern.

Embodiment No. 36 includes a polyimide precursor represented by Formula 2 wherein R4 is a hydrophilic group partially or wholly protected by an base cleavable group, R3 is a thermally-cleavable group, and R5 is hydrogen. It also includes a PBG, and it can include a crosslinker and a photosensitizer, if necessary. The polyimide precursor should be insoluble to a developer solution. The precursor can be designed to be insoluble to the alkali developer solution, or alternatively, the concentration of the base component of the developer solution can be significantly low, e.g., 0.1N or less. The composition can be patterned by irradiating I-line or KrF-line. The developed pattern can be heated to cleave the thermally-cleavable group of R3, if necessary. The thermally-cleavable group of R3 can remain in the relief pattern.

Embodiment No. 37 includes a polyimide precursor represented by Formula 2 wherein R4 is a hydrophilic group, R3 is an acid-cleavable group, and R5 is hydrogen. It also includes DNQ and TAG and it can include a crosslinker and a photosensitizer, if necessary. The DNQ decreases the alkali solubility of the polyimide precursor, and can be patterned by I-line or KrF-line irradiation. The developed pattern can be heated to cleave the acid-cleavable group of R3 by action of the TAG.

Embodiment No. 38 includes a polyimide precursor represented by Formula 2 wherein R4 is a hydrophilic group partially or wholly protected by an acid-cleavable group, R3 is a thermally-cleavable group, and R5 is hydrogen. It also includes a PBG and TAG, and it can include a crosslinker and a photosensitizer, if necessary. The polyimide precursor should be insoluble to a developer solution. The precursor can be designed to be insoluble to the alkali developer solution, or alternatively, the concentration of the base component of the developer solution can be significantly low, e.g., 0.1N or less. By irradiating I-line or KrF-line, the PBG in the exposed region generates a base, which is then quenched by an acid generated from the TAG upon heating. In the non-exposed region, the acid generated from the TAG upon heating cleaves the acid-cleavable group of R4. After developing a pattern, the thermally cleavable group of R3 can be cleaved, if necessary.

Embodiment No. 39 includes a polyimide precursor represented by Formula 2 wherein R3 is a thermally-cleavable group, R4 is a hydrophilic group partially or wholly protected by a crosslinkable group, and R5 is hydrogen. It also includes a PBG and TAG, and it can include a crosslinker and a photosensitizer, if necessary. The polyimide precursor is soluble to a developer solution. By irradiating I-line or KrF-line, the PBG in the exposed region generates a base, which is then quenched by the acid generated from the TAG upon heating. In the non-exposed region, the acid generated from the TAG upon heating causes crosslinking. The developed pattern can be heated to cleave the thermally-cleavable group of R3, if necessary. The thermally-cleavable group of R3 can remain in the relief pattern.

Embodiment No. 40 includes a polyimide precursor represented by Formula 2 wherein R3 is a thermally-cleavable group, R4 is a hydrophilic group partially or wholly protected by a crosslinkable group, and R5 is hydrogen. It also includes an FRG, and it can include a photosensitizer, if necessary. The polyimide precursor is soluble in a developer solution. By irradiating I-line or KrF-line, the exposed region can become insoluble by causing the crosslinking of the polymer. The developed pattern can be heated to cleave the thermally-cleavable group of R3, if necessary. The thermally-cleavable group of R3 can remain in the relief pattern.

Embodiment No. 41 includes a polyimide precursor represented by Formula 2 wherein R3 is an acid-cleavable group, R4 is a hydrophilic group partially or wholly protected by a crosslinkable group, and R5 is hydrogen. It also includes a FRG and a TAG, and it can include a photosensitizer, if necessary. The polyimide precursor is soluble in a developer solution. By irradiating I-line or KrF-line, the exposed region can become insoluble by causing the crosslinking of the polymer. The developed pattern can be heated to cleave the acid-cleavable group of R3 by the action of the TAG, if necessary. The acid-cleavable group of R3 can remain in the relief pattern.

Embodiment No. 42 includes a polyimide precursor represented by Formula 2 wherein R3 is a thermally-cleavable group, R4 is a hydrophilic group partially or wholly protected by a crosslinkable group, and R5 is hydrogen. It also includes a PAG, and it can include a crosslinker and a photosensitizer, if necessary. The polyimide precursor is soluble to a developer solution, but when I line or KrF line irradiated, the exposed region can become insoluble by causing the crosslinking of the polymer. After developing a pattern, it can be heated to cleave the thermally-cleavable group of R3, if necessary. The thermally-cleavable group of R3 can also remain in the relief pattern.

Embodiment No. 43 includes a polyimide precursor represented by Formula 2 wherein R3 is a thermally-cleavable group, R4 is a hydrophilic group partially or wholly protected by a crosslinkable group, and R5 is hydrogen. It also includes a PBG, and it can include a crosslinker and a photosensitizer, if necessary. The polyimide precursor is soluble to a developer solution, but by irradiating I-line or KrF-line, the exposed region can become insoluble by causing the crosslinking of the polymer. After developing a pattern, it can be heated to cleave the thermally-cleavable group of R3, if necessary. The thermally-cleavable group of R3 can also remain in the relief pattern.

Embodiment No. 44 includes a polyimide precursor represented by Formula 2 wherein R3 is an acid-cleavable group, R4 is a hydrophilic group partially or wholly protected by a crosslinkable group, and R5 is hydrogen. It also includes a PBG and TAG, and it can include a crosslinker and a photosensitizer, if necessary. The polyimide precursor is soluble to a developer solution. By irradiating I-line or KrF-line, the PBG in the exposed region generates a base, which is then quenched by the acid generated from the TAG upon heating. In the non-exposed region, the acid generated from the TAG upon heating causes crosslinking. The developed pattern can be heated to cleave the acid-cleavable group of R3 by action of the TAG, if necessary. The acid-cleavable group of R3 can remain in the relief pattern.

Embodiment No. 45 includes a polyimide precursor represented by Formula 2 wherein R3 is an acid-cleavable group, R4 is a hydrophilic group partially or wholly protected by a base-cleavable group, and R5 is hydrogen. It also includes a PBG and TAG, and it can include a crosslinker and a photosensitizer, if necessary. The polyimide precursor should be insoluble to a developer solution. The precursor can be designed to be insoluble to the alkali developer solution, or alternatively, the concentration of the base component of the developer solution can be significantly low, e.g., 0.1N or less. By irradiating I-line or KrF-line, the exposed region can become soluble by the action of the PBG. After developing a pattern, it is heated so as to cleave the acid-cleavable group of R3 by the action of the TAG.

TABLE 2

| | Photosensitive composition | | | | | | | | | | |
|---|---|---|---|---|---|---|---|---|---|---|---|
| | Polyimide precursor represented by Formula 2 | | | | | | | | | | |
| | R3 | | | R5 | | R4 | | | | | |
| | | | | | | | Hydrophilic group protected | Hydrophilic group protected | Hydrophilic group protected | | | |
| No. | acid-cleavable group | base-cleavable group | thermally-cleavable group | hydro-gen | acid-cleavable group | Hydro-philic group | by acid-cleavable group | by base-cleavable group | by cross-linkable group | Active Compound[1] | Exposure Light[2] | positive/negative[3] |
| 17 | | | x | | x | x | | | | DNQ | I or KrF | p |
| 18 | x | | | | x | x | | | | DNQ + PAG | I + KrF | p |
| 19 | | x | | | x | x | | | | DNQ + PBG | I + KrF | p |
| 20 | | x | | | x | | x | | | PAG | I or KrF | p |
| 21 | | x | | | x | | | x | | PBG | I or KrF | p |
| 22 | x | | | | x | x | | | | DNQ + TAG | I or KrF | p |
| 23 | | x | | | x | | x | | | PBG + TAG | I or KrF | n |
| 24 | | x | | | x | | | | x | PBG + TAG | I or KrF | p |
| 25 | | x | | | x | | | | x | FRG | I or KrF | n |
| 26 | x | | | | x | | | | x | FRG + TAG | I or KrF | n |
| 27 | | x | | | x | | | | x | PAG | I or KrF | n |
| 28 | | x | | | x | | | | x | PBG | I or KrF | n |
| 29 | x | | | | x | | | | x | PBG + TAG | I or KrF | p |
| 30 | | x | | | x | x | | | | PBG | I or KrF | n |
| 31 | x | | | | x | | | x | | PBG + TAG | I or KrF | p |
| 32 | | x | x | | x | | | | | DNQ | I or KrF | p |
| 33 | x | | | x | | x | | | | DNQ + PAG | I + KrF | p |
| 34 | x | | | x | | x | | | | DNQ + PBG | I + KrF | p |
| 35 | | x | x | | | | x | | | PAG | I or KrF | p |
| 36 | | x | x | | | | | x | | PBG | I or KrF | p |
| 37 | x | | | x | | x | | | | DNQ + TAG | I or KrF | p |
| 38 | | x | x | | | | x | | | PBG + TAG | I or KrF | n |
| 39 | | x | x | | | | | | x | PBG + TAG | I or KrF | p |
| 40 | | x | x | | | | | | x | FRG | I or KrF | n |
| 41 | x | | | x | | | | | x | FRG + TAG | I or KrF | n |
| 42 | | x | x | | | | | | x | PAG | I or KrF | n |
| 43 | | x | x | | | | | | x | PBG | I or KrF | n |
| 44 | x | | | x | | | | | x | PBG + TAG | I or KrF | p |
| 45 | x | | | x | | | | x | | PBG + TAG | I or KrF | p |

[1]DNQ represents a diazonaphthoquinone compound, PAG represents a photo-acid generator, PBG represents a photo-base generator, TAG represents a thermal acid generator, and FRG represents a free radical generator.
[2]I represents an actinic light having wavelength of 365 nm, and KrF represents an actinic light having wavelength of 248 nm.
[3]Lower-case letter p represents a positive-acting composition, and lower-case letter n represents a negative-acting composition.

EXAMPLES

The present invention is hereinafter described based on the Examples of the present invention.

Production Examples 1

The compound having a Formula 18 was provided.

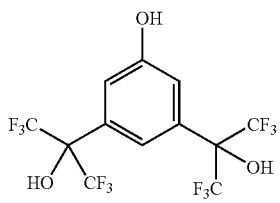

Formula 18

In a three-neck flask having a volume of 300 mL, 20.00 grams of the compound as represented by Formula 18, 10.82 g of 3,5-dinitrobenzoylchloride, 4.6 mL of pyridine and 150 mL of dichloromethane were provided and mixed together in a nitrogen atmosphere at a temperature of 40° C. for a period of three hours. The reaction liquid was put into an HCl solution having a concentration of 0.6 N, thereby forming a white precipitate, which was collected by filtration. The filtered precipitate was subjected to vacuum drying at room temperature. The yield was 72% (20.97 g). The results of the NMR spectrum showed that the obtained compound has a structure represented by Formula 19.

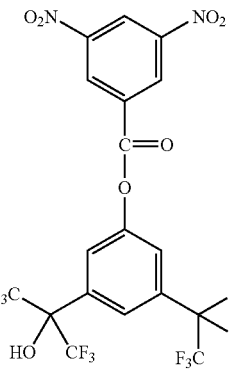

Formula 19

Production Example 2

In a three-neck flask having a volume of 300 mL, 9.90 g of the compound as prepared in Production Example 1, 0.97 g of 10% palladium carbon and 75 mL of N,N-dimethylformamide (DMF) were mixed for a period of 12 hours. The reaction liquid was subjected to a Celite treatment, and the filtrate was put into water, thereby forming a precipitate, which was collected. The collected precipitate was purified by recrystallization from a mixture of water and methanol to obtain a white powder. The yield was 57% (5.13 g). The results of the NMR spectrum showed that obtained compound has a structure represented by Formula 20.

Formula 20

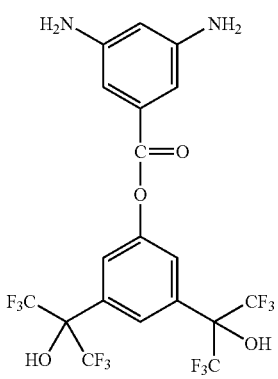

Production Example 3

In a three-neck flask having a volume of 300 mL, 1.50 g of the compound as prepared in Production Example 2, 1.19 g of 6FDA (2,2-bis(3,4-dicarboxyphenyl) hexafluoropropanoic acid dianhydride) and 10.8 mL of N,N-dimethylacetamide (DMAc) were mixed for a period of 5 hours. The reaction liquid was put into a mixture of methanol and water, precipitating the polymer. The polymer as precipitated was collected by filtration, and then subjected to vacuum drying at a temperature of 50° C. The yield was 95% (2.5 g). Then, the polymer was dissolved in DMAc to a concentration of 0.1 g/dL. The intrinsic viscosity measured by an Ostwald viscometer was 0.4 dL/g. The results of NMR spectrum showed that the obtained polymer has a structure represented by Formula 21.

Formula 21

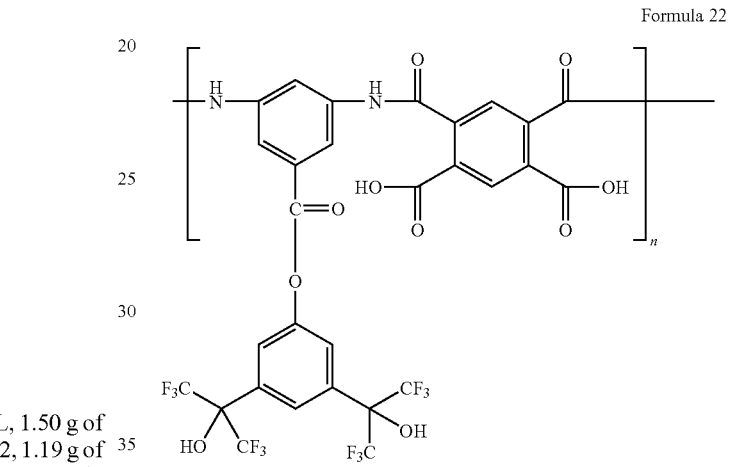

Production Example 4

In a three-neck flask having a volume of 300 mL, 1.50 g of the compound as prepared in Production Example 2, 0.58 g of PMDA (pyromellitic dianhydride, 1,2,4,5-benzenetetracarboxylic dianhydride) and 8.2 mL of N,N-dimethylacetamide (DMAc) were mixed for a period of 5 hours. The reaction liquid was put into a mixture of methanol and water to precipitate the polymer. The polymer as precipitated was collected by filtration, and then subjected to vacuum drying at a temperature of 50° C. The yield was 90% (1.87 g). Then, the polymer was dissolved in DMAc to become a concentration of 0.1 g/dL. The intrinsic viscosity measured by an Ostwald viscometer was 0.12 dL/g. The results of the NMR spectrum showed that the obtained polymer has a structure represented by Formula 22.

Formula 22

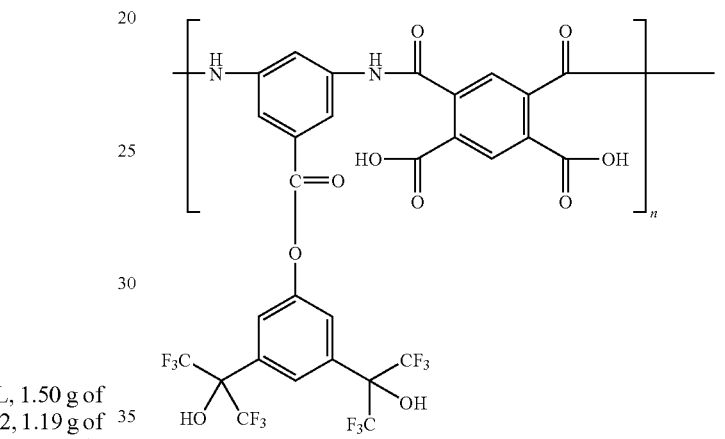

Production Example 5

In a three-neck flask having a volume of 300 mL, 1.00 g of the compound as prepared in Production Example 2, 0.20 g of PMDA, 0.40 g of 6FDA and 4 mL of N,N-dimethylacetamide (DMAc) were mixed for a period of 5 hours. The reaction liquid was put into a mixture of methanol and water to precipitate the polymer. The polymer as precipitated was collected by filtration, and then subjected to vacuum drying at a temperature of 50° C. The yield was 93% (1.49 g). Then, the polymer was dissolved in DMAc to become a concentration of 0.1 g/dL. The intrinsic viscosity measured by an Ostwald viscometer was 0.14 dL/g. The results of the NMR spectrum showed that the obtained polymer has a structure represented by Formula 23.

Formula 23

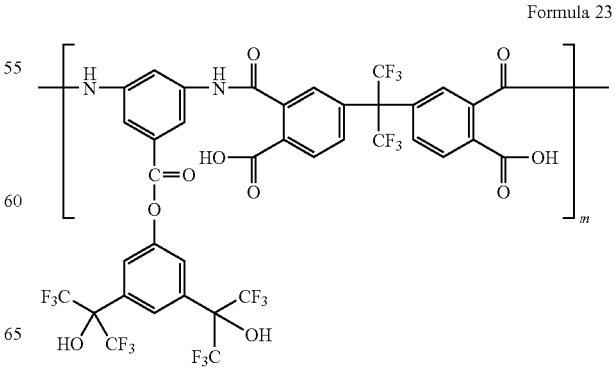

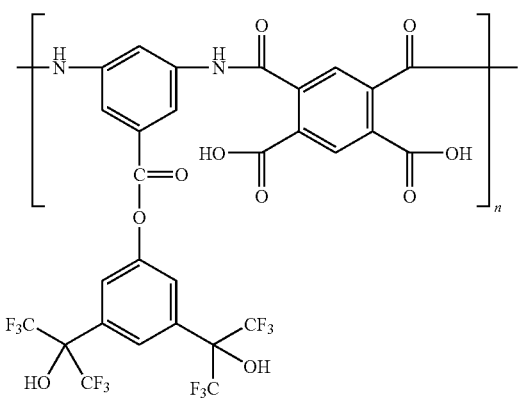

Production Example 6

In a three-neck flask having a volume of 300 mL, 0.5 g of the polymer obtained by Production Example 3, 0.10 g of pyridine, 0.13 g of acetic anhydride and 4.5 g of were mixed at a temperature of 110° C. for a period of 12 hours in a nitrogen atmosphere. The reaction liquid was put into a mixture of methanol and water to precipitate the polymer. The polymer as precipitated was collected by filtration, and then subjected to vacuum drying at a temperature of 100° C. The yield was 90% (0.43 g). The results of the NMR and IR spectra showed that the obtained polymer has a structure represented by Formula 24. The intrinsic viscosity measured by an Ostwald viscometer at a temperature of 30° C. was 0.4 dL/g. The IR spectrum is shown in FIG. 1. The polymer having a structure represented by Formula 24 was well soluble in a tetramethylammonium aqueous solution having a concentration of 2.38 wt %. Additionally, the polymer having a structure represented by Formula 24 was well soluble in acetone, methanol, tetrahydrofuran, and propylene glycol monomethylether acetate.

Formula 24

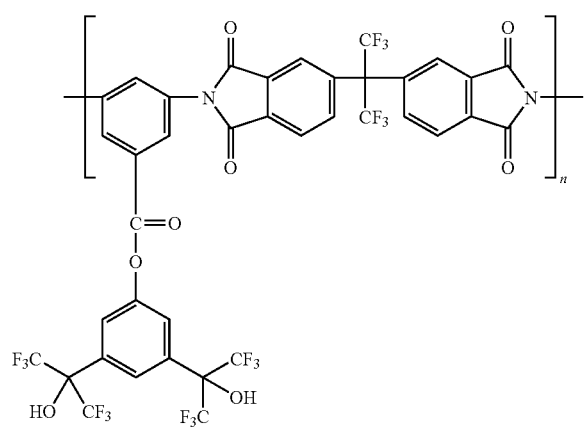

Production Example 7

In a three-neck flask having a volume of 300 mL, 1.2 g of the polymer obtained by Production Example 4, 0.27 g of pyridine, 0.32 g of acetic anhydride and 7.0 g of DMF were mixed at a temperature of 110° C. for a period of 12 hours in a nitrogen atmosphere. The reaction liquid was put into a mixture of methanol and water to precipitate the polymer. The polymer as precipitated was collected by filtration, and then subjected to vacuum drying at a temperature of 100° C. The yield was 87% (1.00 g). The results of NMR and IR spectra showed that the obtained polymer has a structure represented by Formula 25. The intrinsic viscosity measured by an Ostwald viscometer at a temperature of 30° C. was 0.12 dL/g. The polymer having a structure represented by Formula 25 was well soluble in a tetramethylammonium aqueous solution having a concentration of 2.38 wt %. Additionally, the polymer having a structure represented by Formula 25 was well soluble in methanol, tetrahydrofuran, and propylene glycol monomethylether acetate.

Formula 25

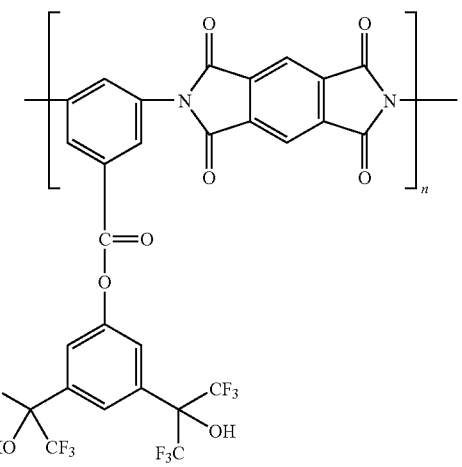

Production Example 8

In a three-neck flask having a volume of 300 mL, 1.2 g of the polymer obtained by Production Example 5, 0.27 g of pyridine, 0.32 g of acetic anhydride and 7.0 g of DMF were mixed at a temperature of 110° C. for a period of 12 hours in a nitrogen atmosphere. The reaction liquid was put into a mixture of methanol and water to precipitate the polymer. The polymer as precipitated was collected by filtration, and then subjected to vacuum drying at a temperature of 100° C. The yield was 87% (1.00 g). The results of NMR and IR spectra showed that the obtained polymer has a structure represented by Formula 26. The intrinsic viscosity measured by an Ostwald viscometer at a temperature of 30° C. was 0.12 dL/g. The polymer having a structure represented by Formula 26 was well soluble in a tetramethylammonium aqueous solution having a concentration of 2.38 wt %. Additionally, the polymer having a structure represented by Formula 26 was well soluble in methanol, tetrahydrofuran, and propylene glycol monomethylether acetate.

Formula 26

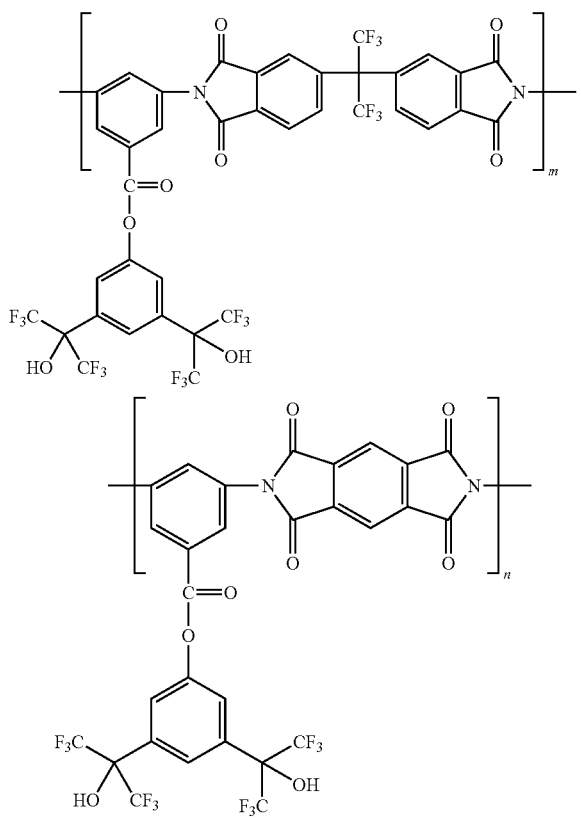

Example 1

Diazonaphthoquinone as represented by the following Formula 27 was provided.

Formula 27

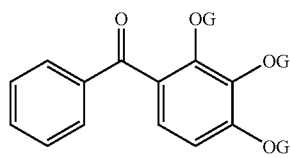

In Formula 27, G represents hydrogen and/or the Formula 28 at a ratio of approximately 34/66 and is herein referred to as "THBP".

Formula 28

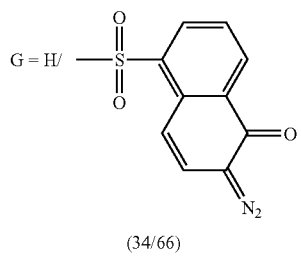

Into a vessel, 15 parts by weight of the polyimide resin obtained in Production Example 6, 5 parts by weight of the THBP having Formula 27, and 80 parts by weight of propylene glycol methyl ether acetate (PGMEA) were mixed together. After homogeneously mixed, the mixture was filtrated to prepare Sample A. Thus, the THBP was included at an amount of 5 wt % in the resist composition, and at an amount of 25 wt % in the solid contents of the resist composition.

Example 2

Sample B was prepared in the same manner as Example 1 except for adding 16 parts by weight of the polyimide resin obtained in Production Example 6, and 4 parts by weight of the THBP having formula. Thus, the THBP was included at an amount of 4 wt % in the resist composition, and at an amount of 20 wt % in the solid contents of the resist composition.

Example 3

Sample C was prepared in the same manner as Example 1 except for adding 17 parts by weight of the polyimide resin obtained in Production Example 6, and 3 parts by weight of the THBP having formula. Thus, the THBP was included at an amount of 3 wt % in the resist composition, and at an amount of 15 wt % in the solid contents of the resist composition.

Comparative Example 1

Sample D was prepared in the same manner as Example 1 except for adding 20 parts by weight of the polyimide resin obtained in Production Example 6. Thus, the THBP was not included in the resist composition.

Each of the Samples A to D was applied to a silicon substrate by means of spin coating at a rotation speed of 1000 rpm for a period of 30 seconds. Then, the silicon substrate was heated at a temperature of 80° C. for a period of 3 minutes, obtaining a film, having a thickness of 1.5 μm.

The surface of the film was covered by a mask having a pattern with size of line/space=150 μm/220 p.m. Thereafter, it was exposed to I-line, having a wavelength of 365 nm at a dose amount of 2 J/cm$^2$. After the radiation, the film was developed in a tetramethylammonium hydroxide aqueous solution having a concentration of 0.26 N. Then, the film was cured at a temperature of 250° C. for a period of 30 minutes.

Figure 2:
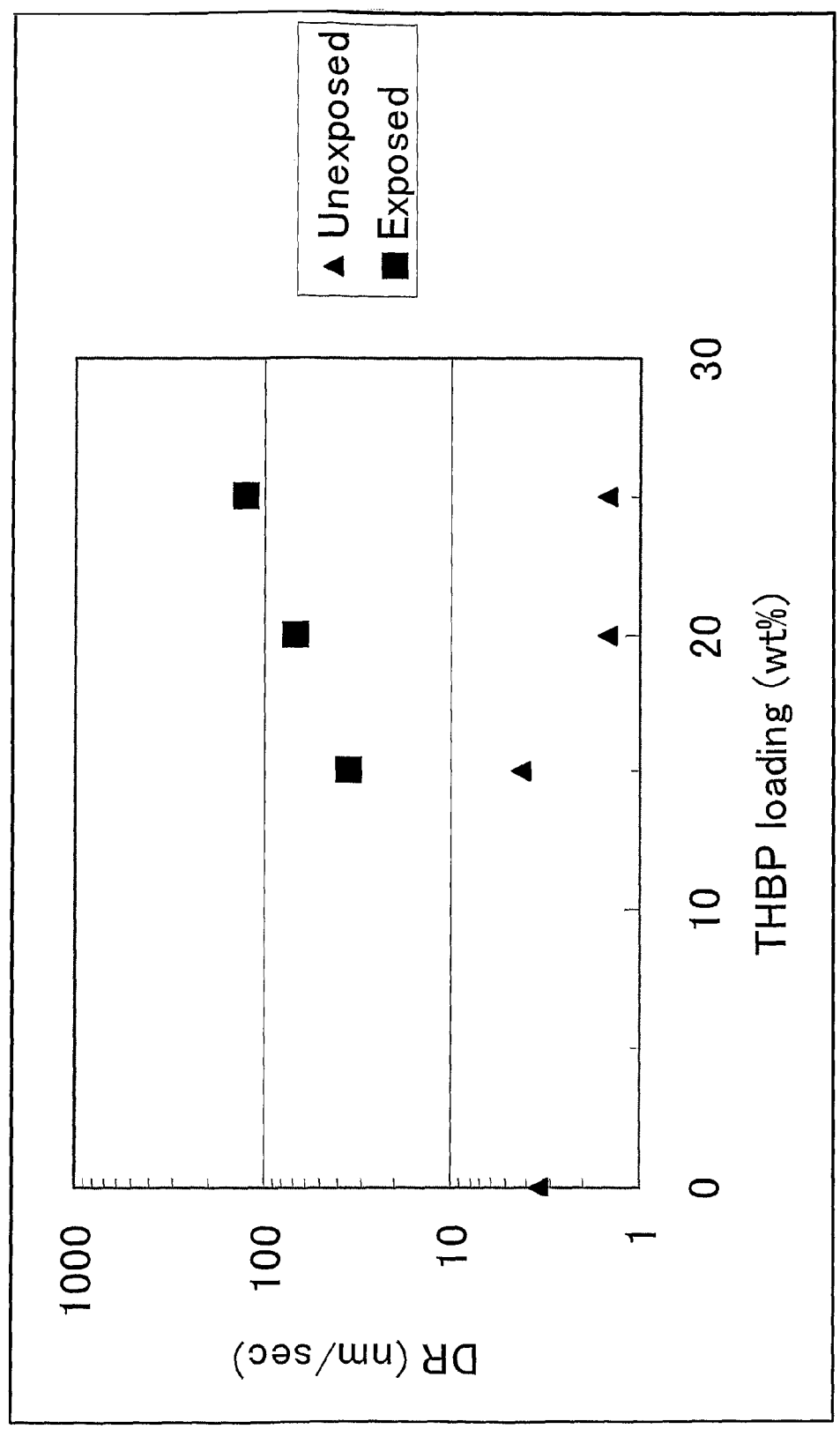
FIG. 2 shows the relationship of the dissolution rate versus the amount of photosensitive compound added.

The dissolution rates (DRs) in tetramethyl ammonium hydroxide aqueous solution were measured using a custom-made spectroscopic reflectometer based DR monitor. FIG. 2 shows the relationship of the dissolution rates between the exposed region and non-exposed regions. In FIG. 2, "THBP loading" means the THBP concentration is the solid contents of the resist composition. Samples A to C showed sufficient difference between the dissolution rates on the exposed region and the non-exposed region. For example, the exposed region of Sample B, including THBP at a concentration of 20 wt % in the solid contents, had a dissolution rate 45-times more than the non-exposed region. The relationship obtained in the present invention was found to be sufficient for carrying out resist patterning.

Figure 3:
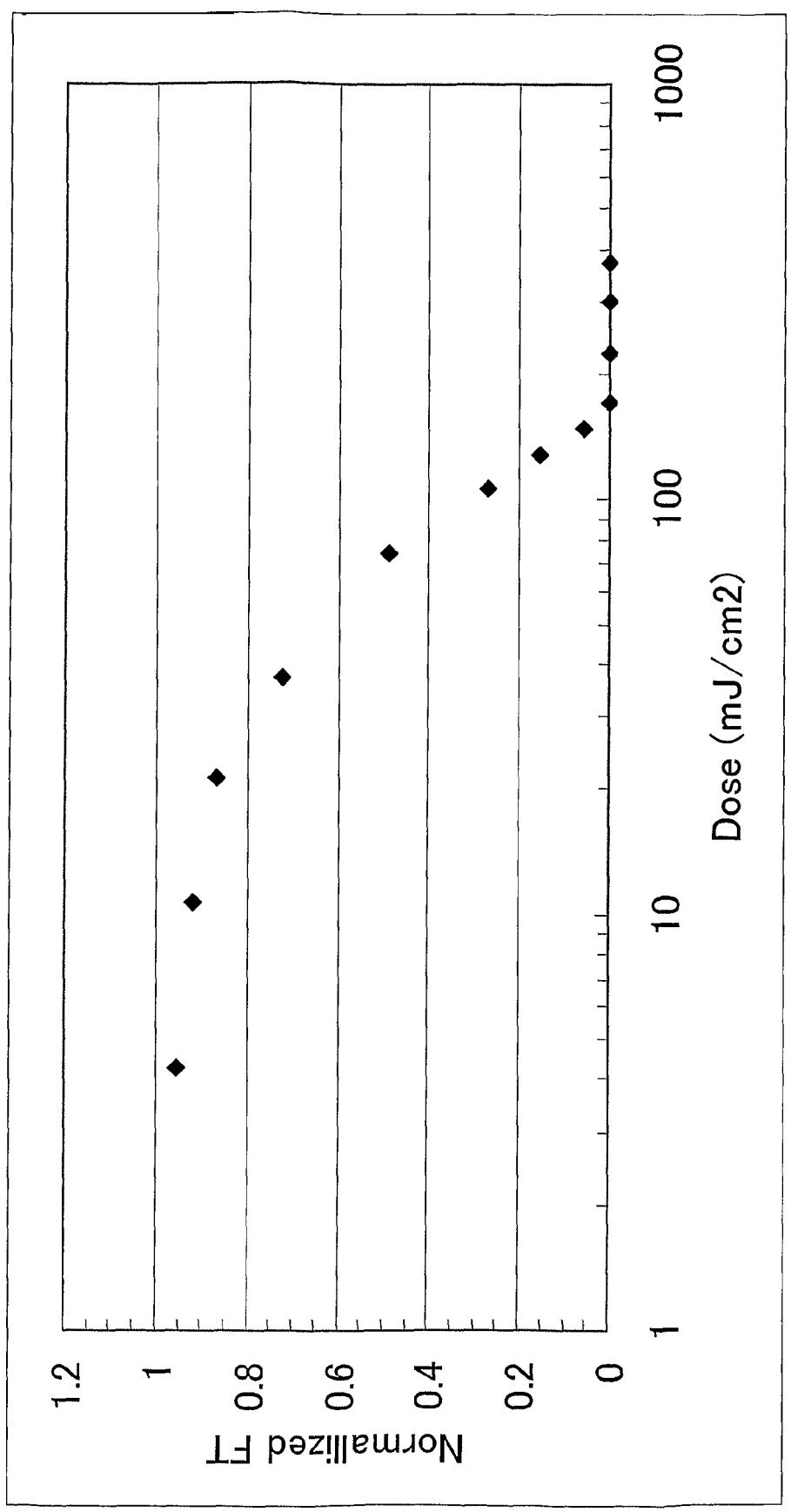
FIG. 3 shows the contrast curve for the polyimide-based photosensitive formulation.

With respect to the resist composition of Example 2, the dose amount of the I-line was varied to examine the sensitivity of the composition. FIG. 3 shows the results. The resulting contrast curve for this material shows that the material exhibits a sensitivity of approximately 170 mJ/cm$^2$ and a contrast of 1.32.

Figure 4:
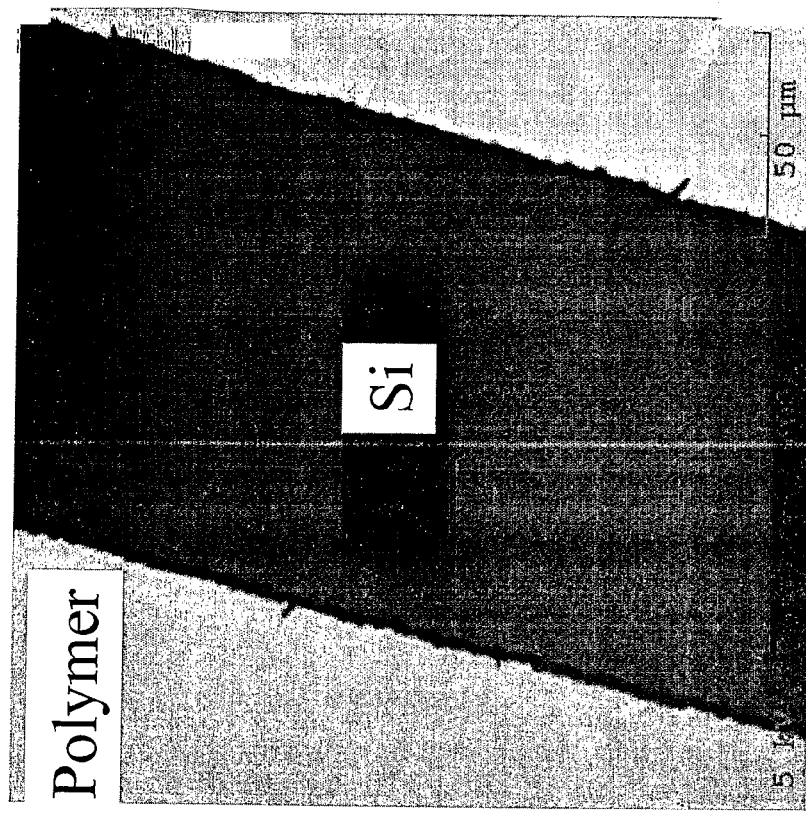
FIG. 4 shows a SEM picture taken of the developed pattern formed from the exposure and development of the photosensitive composition of the present invention.
Figure 4:
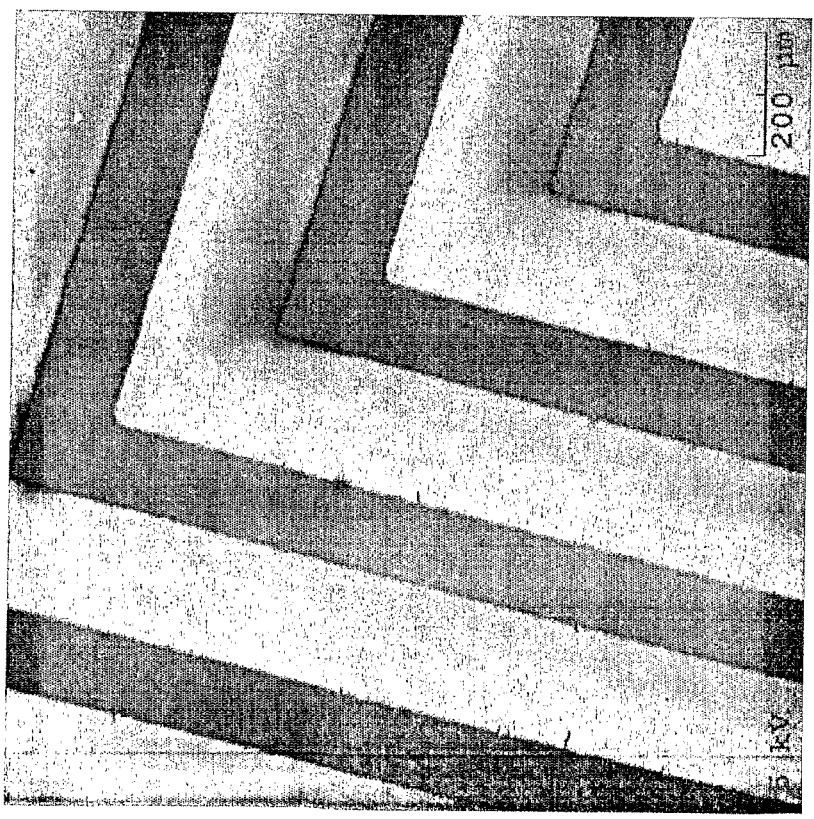

FIG. 4 shows SEM pictures taken with respect to the developed pattern formed from the photosensitive composition of Example 2 with a dose amount of 210 mJ/cm². The film was cured at a temperature of 250° C. for a period of 30 minutes. The obtained pattern of the polyimide on the silicon substrate corresponded to the pattern of the mask used. In particular, the lines of the polyimide were clearly formed with an interval of 150 μm.

Figure 5:
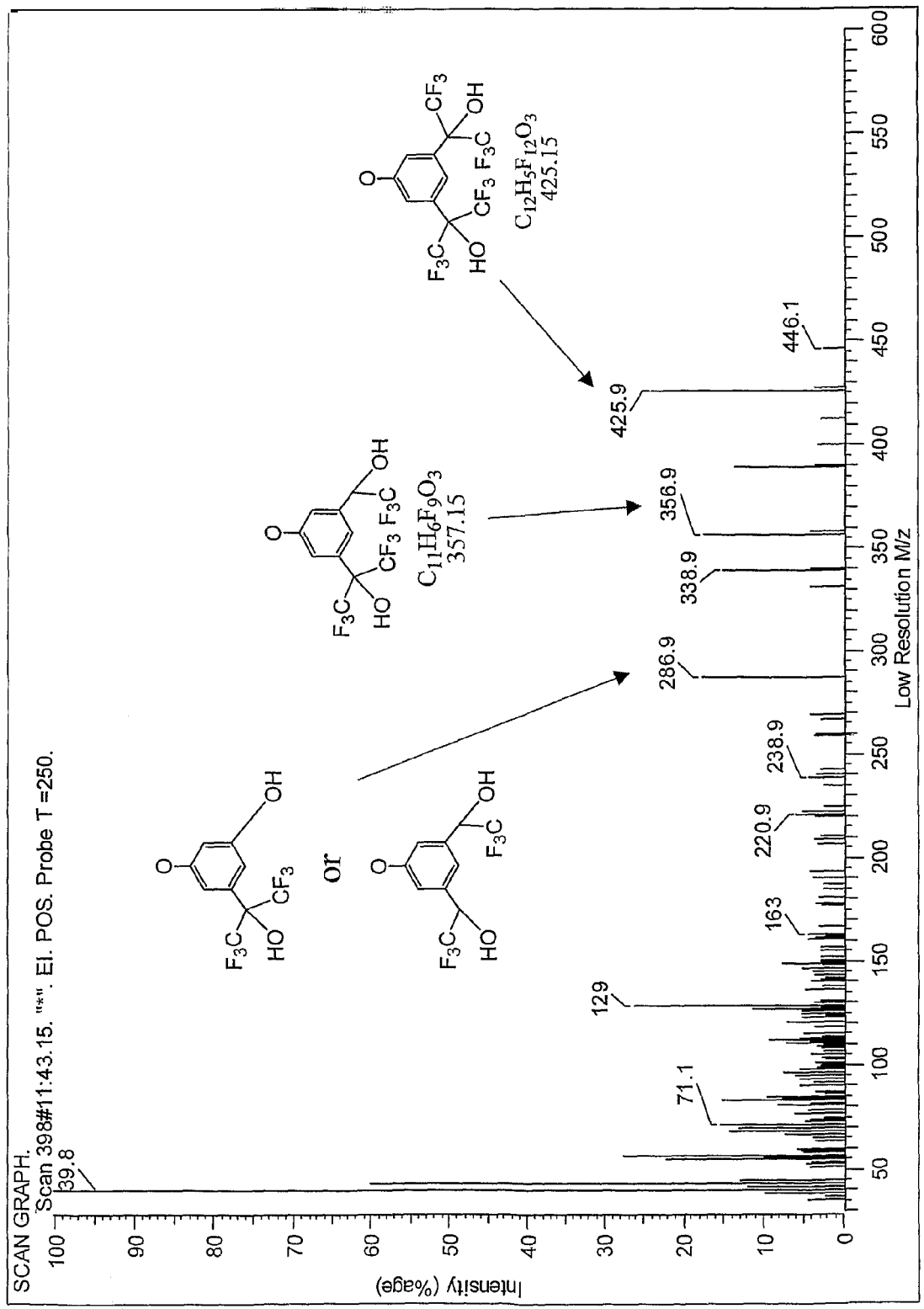
FIG. 5 shows a mass spectrum at 250° C. of the polyimide of the present invention.

FIG. 5 shows a mass spectrum of the polyimide as represented by Formula 24 at 250° C. In the spectrum, a parent peak at M/z of 425.9 was consistent with the mass number of HFA-containing side-group, and the successive elimination of $CF_3$ groups was also detected.

By means of a thermal gravimetric measurement, the side-group cleavage was observed under a significantly low temperature (100-200° C.) in the polyimide as represented by Formula 24 by mixing with either p-toluenesulfonic acid or camphor sulfonic acid, and the mixture of the polyimide as represented by Formula 24 or the acid which was generated by mixing in a triphenylsulfonium hexafluoroantimonate (photoacid generator (PAG)) and 9-anthracene methanol (photosensitizer) with the polymer and subsequently exposing the mixture to broadband UV light and heating the film. After the side-group cleavage, the film was insoluble in the developer solution and was measured to have a dielectric constant of 2.60 at a frequency of 1 MHz (dielectric constant before side group cleavage was measured as 3.30). This reduction in the dielectric constant as a result of the side group cleavage is very desirable for dielectric applications, and thus shows one advantage of such a material containing cleavable, solubilizing functional groups.

What is claimed is:

1. A photosensitive composition, comprising:
a polyimide comprising a repeating unit as represented by Formula 1:

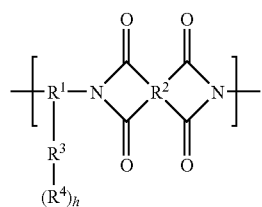

Formula 1 where R1 represents an aliphatic, alicyclic, aromatic or heterocyclic group; R2 represents an aliphatic, alicyclic, aromatic or heterocyclic group; R3 represents at least one of the following formulas:

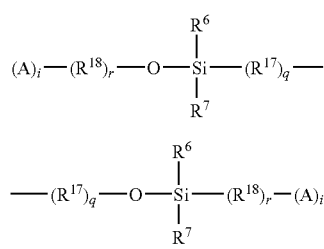

Formula 3

Formula 3a where A represents R4; R6, R7, R17, and R18 each represents an organic group having a carbon number of 1 to 40; r and q each represents an integer of 0 or 1; and i represents an integer of 1 or more;

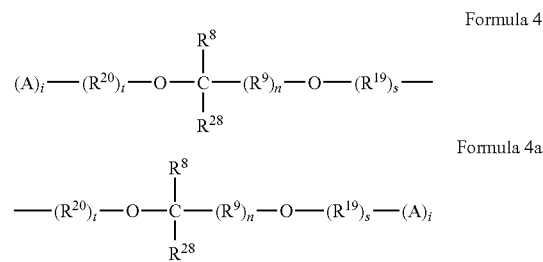

Formula 4

Formula 4a where A represents R4; R8 and R28 each represents hydrogen or an organic group having a carbon number of 1 to 40; R9, R19, and R20 each represents an organic group having a carbon number of 1 to 40; n, s, and t each represents an integer of 0 or 1; and i represents an integer of 1 or more;

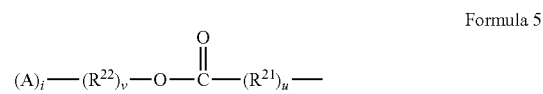

Formula 5 where A represents R4; R21 and R22 each represents an organic group having a carbon number of 1 to 40; u and v each represents an integer of 0 or 1; and i represents an integer of 1 or more;

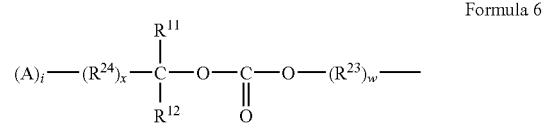

Formula 6

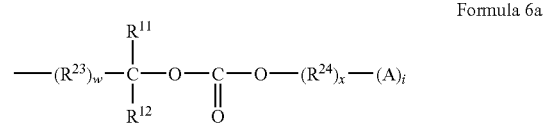

Formula 6a where A represents R4; R11 and R12 each represents hydrogen or an organic group having a carbon number of 1 to 40; R23 and R24 each represents an organic group having a carbon number of 1 to 40; w and x each represents an integer of 0 or 1; and i represents an integer of 1 or more;

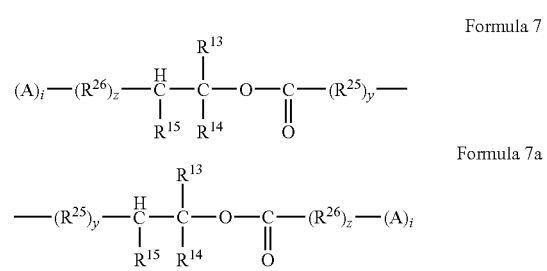

Formula 7

Formula 7a where A represents R4; R13, R14 and R15 each represents hydrogen or an organic group having a carbon number of 1 to 40; R25 and R26 each represents an organic group having a carbon number of 1 to 40; y and z each represents an integer of 0 or 1; and i represents an integer of 1 or more;

R4 represents a monofunctional hydrophilic group or a monofunctional hydrophilic group protected by second acid-cleavable group, second base-cleavable group, or crosslinkable cleavable group; and, h represents an integer of 1 or more; and a photosensitive additive.

2. A photosensitive composition, comprising:

a polyimide precursor comprising a repeating unit as represented by Formula 2:

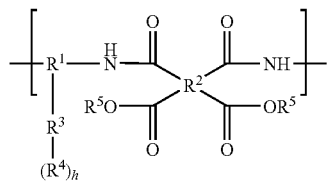

Formula 2 where R1 represents an aliphatic, alicyclic, aromatic or heterocyclic group; R2 represents an aliphatic, alicyclic or aromatic group; R3 represents at least one of the following formulas:

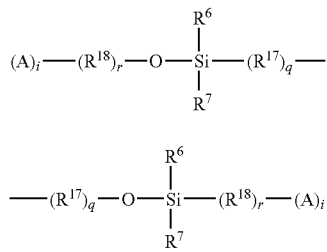

Formula 3

Formula 3a where A represents R4; R6, R7, R17, and R18 each represents an organic group having a carbon number of 1 to 40; r and q each represents an integer of 0 or 1; and i represents an integer of 1 or more;

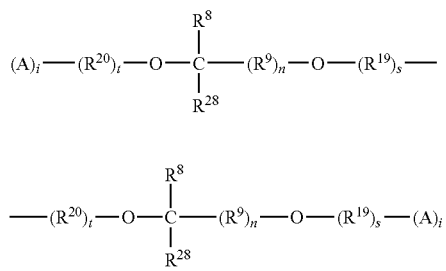

Formula 4

Formula 4a where A represents R4; R8 and R28 each represents hydrogen or an organic group having a carbon number of 1 to 40; R9, R19, and R20 each represents an organic group having a carbon number of 1 to 40; n, s, and t each represents an integer of 0 or 1; and i represents an integer of 1 or more;

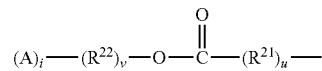

Formula 5 where A represents R4; R21 and R22 each represents an organic group having a carbon number of 1 to 40; u and v each represents an integer of 0 or 1; and i represents an integer of 1 or more;

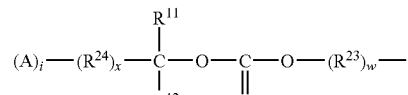

Formula 6

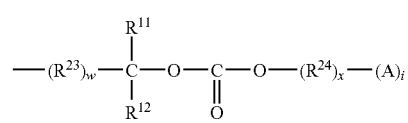

Formula 6a where A represents R4; R11 and R12 each represents hydrogen or an organic group having a carbon number of 1 to 40; R23 and R24 each represents an organic group having a carbon number of 1 to 40; w and x each represents an integer of 0 or 1; and i represents an integer of 1 or more;

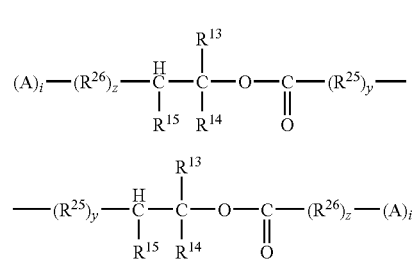

Formula 7

Formula 7a where A represents R4; R13, R14 and R15 each represents hydrogen or an organic group having a carbon number of 1 to 40; R25 and R26 each represents an organic group having a carbon number of 1 to 40; y and z each represents an integer of 0 or 1; and i represents an integer of 1 or more; R4 represents a monofunctional hydrophilic group or a monofunctional hydrophilic group protected by second acid-cleavable group, second base-cleavable group or crosslinkable cleavable group; R5 represents hydrogen or a third acid-cleavable group, and h represents an integer of 1 or more; and a photosensitive additive.

3. A photosensitive composition according to claim 1 or 2, wherein the photosensitive additive comprises a diazonaphthoquinone compound, a photo-acid generator, a photo-base generator, a free radical generator, or combinations thereof, and wherein the photosensitive additive differentiates the dissolution rate of the exposed areas versus the non-exposed areas in a developer solution in order to form a relief pattern.

4. A photosensitive composition according to claim 3, further comprising a thermal acid generator, a crosslinker, a photosensitizer, or combinations thereof.

5. A photosensitive composition according to claim 1 or 2, wherein R3 represents an organic group represented by Formula 3 or Formula 3a:

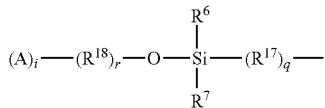

Formula 3

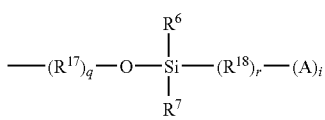

Formula 3a where A represents R4; R6, R7, R17, and R18 each represents an organic group having a carbon number of 1 to 40; r and q each represents an integer of 0 or 1; and i represents an integer of 1 or more.

6. A photosensitive composition according to claim 1 or 2, wherein R3 represents an organic group represented by Formula 4 or Formula 4a:

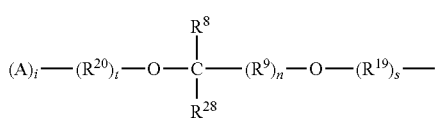

Formula 4

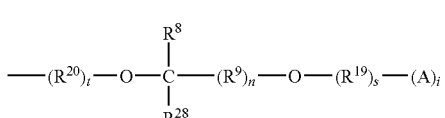

Formula 4a where A represents R4; R8 and R8 each represents hydrogen or an organic group having a carbon number of 1 to 40; R9, R19, and R20 each represents an organic group having a carbon number of 1 to 40; n, s, and t each represents an integer of 0 or 1; and i represents an integer of 1 or more.

7. A photosensitive composition according to claim 1 or 2, wherein R3 represents an organic group represented by Formula 5 or Formula 5a:

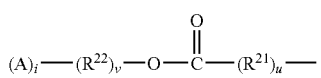

Formula 5 where A represents R4; R21 and R22 each represents an organic group having a carbon number of 1 to 40; u and v each represents an integer of 0 or 1; and i represents an integer of 1 or more.

8. A photosensitive composition according to claim 1 or 2, wherein R3 represents an organic group represented by Formula 6 or Formula 6a:

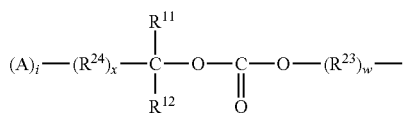

Formula 6

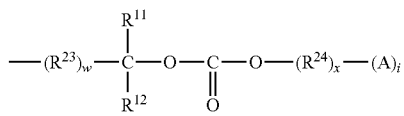

Formula 6a where A represents R4; R11 and R12 each represents hydrogen or an organic group having a carbon number of 1 to 40; R23 and R24 each represents an organic group having a carbon number of 1 to 40; w and x each represents an integer of 0 or 1; and i represents an integer of 1 or more.

9. A photosensitive composition according to claim 1 or 2, wherein R3 represents an organic group represented by Formula 7 or Formula 7a:

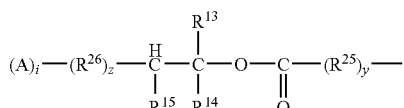

Formula 7

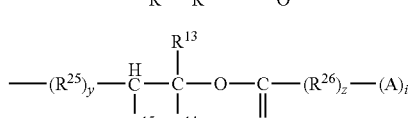

Formula 7a where A represents R4; R13, R14 and R15 each represents hydrogen or an organic group having a carbon number of 1 to 40; R25 and R26 each represents an organic group having a carbon number of 1 to 40; y and z each represents an integer of 0 or 1; and i represents an integer of 1 or more.

10. A photosensitive composition according to claim 1 or 2, wherein R4 represents an organic group represented by Formula 8:

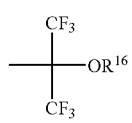

Formula 8 where R16 represents hydrogen, an acid-cleavable group, a base-cleavable group or a crosslinkable group.

11. A photosensitive composition according to claim 1 or 2, wherein R4 represents an organic group represented by Formula 9:

Formula 9 where R16 represents hydrogen, an acid-cleavable group, a base-cleavable group or a crosslinkable group.

12. A photosensitive composition according to claim 1 or 2, wherein R4 represents an organic group represented by Formula 10:

   Formula 10 where R16 represents hydrogen, an acid-cleavable group, a base-cleavable group or a crosslinkable group.

13. A photosensitive composition according to claim 1 or 2, wherein R4 represents an organic group represented by Formula 11:

   Formula 11 where R16 represents hydrogen, an acid-cleavable group, a base-cleavable group or a crosslinkable group.

14. A photosensitive composition according to claim 1 or 2, wherein R4 represents an organic group represented by Formula 12:

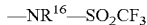   Formula 12 where R16 represents hydrogen, an acid-cleavable group, a base-cleavable group or a crosslinkable group.

15. A photosensitive composition according to claim 10, wherein R1 represents an organic group represented by Formula 13, R3 represents an organic group represented by Formula 14, wherein A represents R4, and m represents an integer of 1, 2, 3, 4 or 5:

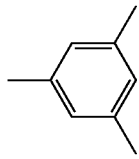

Formula 13

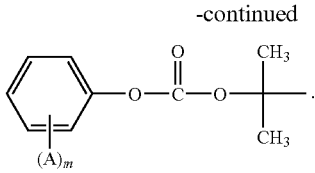

Formula 14

16. A photosensitive composition according to claim 10, wherein R1 represents an organic group represented by Formula 13, R3 represents an organic group represented by Formula 15, wherein D represents R4, and o represents an integer of 1, 2, 3, 4 or 5:

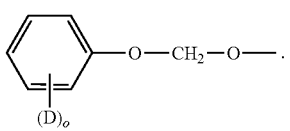

Formula 15

17. A photosensitive composition according to claim 10, wherein R1 represents an organic group represented by Formula 13, R3 represents an organic group represented by Formula 16, wherein E represents R4, and p represents an integer of 1, 2, 3, 4 or 5:

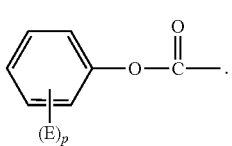

Formula 16

* * * * *